US 7,696,556 B2

(12) United States Patent
Hur et al.

(10) Patent No.: US 7,696,556 B2
(45) Date of Patent: Apr. 13, 2010

(54) NONVOLATILE MEMORY DEVICES INCLUDING HIGH-VOLTAGE MOS TRANSISTORS WITH FLOATED DRAIN-SIDE AUXILIARY GATES AND METHODS OF FABRICATING THE SAME

(75) Inventors: Sung-Hoi Hur, Seoul (KR); Young-Min Park, Hwaseong-si (KR); Sang-Bin Song, Yongin-si (KR); Min-Cheol Park, Seoul (KR); Ji-Hwon Lee, Suwon-si (KR); Su-Youn Yi, Yongin-si (KR); Jang-Min Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 458 days.

(21) Appl. No.: 11/518,724

(22) Filed: Sep. 11, 2006

(65) Prior Publication Data

US 2007/0063257 A1    Mar. 22, 2007

(30) Foreign Application Priority Data

Sep. 22, 2005    (KR) ...................... 10-2005-0088335

(51) Int. Cl.
*H01L 29/788*    (2006.01)
*H01L 21/8238*    (2006.01)

(52) U.S. Cl. ................. 257/315; 257/316; 257/E29.17; 257/E29.177

(58) Field of Classification Search ...................... 257/4, 257/36, 38, 39, 61, 71, 124, 133, 151, 153, 257/288, 296, 315, 316, 318, 319, 320, 326, 257/314, E29.129, E29.3, E21.422; 438/258
See application file for complete search history.

(56) References Cited

U.S. PATENT DOCUMENTS

| 5,793,081 | A | * | 8/1998 | Tomioka et al. | ............. | 257/319 |
| 6,074,914 | A | * | 6/2000 | Ogura | ........................ | 438/257 |
| 6,933,195 | B2 | * | 8/2005 | Lee | ............................ | 438/258 |
| 7,057,931 | B2 | * | 6/2006 | Lutze et al. | ............ | 365/185.18 |
| 7,110,297 | B2 | * | 9/2006 | Morikawa et al. | ...... | 365/185.14 |

(Continued)

FOREIGN PATENT DOCUMENTS

JP    6-260510    9/1994

(Continued)

*Primary Examiner*—Leonardo Andújar
*Assistant Examiner*—William Harriston
(74) *Attorney, Agent, or Firm*—Mills & Onello, LLP

(57) ABSTRACT

High-voltage MOS transistors with a floated drain-side auxiliary gate are provided. The high-voltage MOS transistors include a source region and a drain region provided in a semiconductor substrate. A main gate electrode is disposed over the semiconductor substrate between the drain region and the source region. A lower drain-side auxiliary gate and an upper drain-side auxiliary gate are sequentially stacked over the semiconductor substrate between the main gate electrode and the drain region. The lower drain-side auxiliary gate is electrically insulated from the semiconductor substrate, the main gate electrode and the upper drain-side auxiliary gate. Methods of fabricating the high-voltage MOS transistors are also provided.

38 Claims, 20 Drawing Sheets

U.S. PATENT DOCUMENTS

| | | | |
|---|---|---|---|
| 7,154,147 B1 * | 12/2006 | Yamazaki et al. | 257/347 |
| 2003/0127681 A1 * | 7/2003 | Nishioka et al. | 257/315 |
| 2004/0235249 A1 * | 11/2004 | Schaijk | 438/266 |
| 2005/0020013 A1 * | 1/2005 | Moriya et al. | 438/262 |
| 2005/0099849 A1 * | 5/2005 | Lutze et al. | 365/185.18 |
| 2005/0184334 A1 * | 8/2005 | Kim et al. | 257/324 |
| 2006/0171206 A1 * | 8/2006 | Wong et al. | 365/185.28 |
| 2007/0232000 A1 * | 10/2007 | Kuo et al. | 438/261 |

FOREIGN PATENT DOCUMENTS

| | | |
|---|---|---|
| JP | 2004-235527 | 8/2004 |
| KR | 10-0364815 | 12/2002 |
| KR | 10-0436287 | 6/2004 |

\* cited by examiner

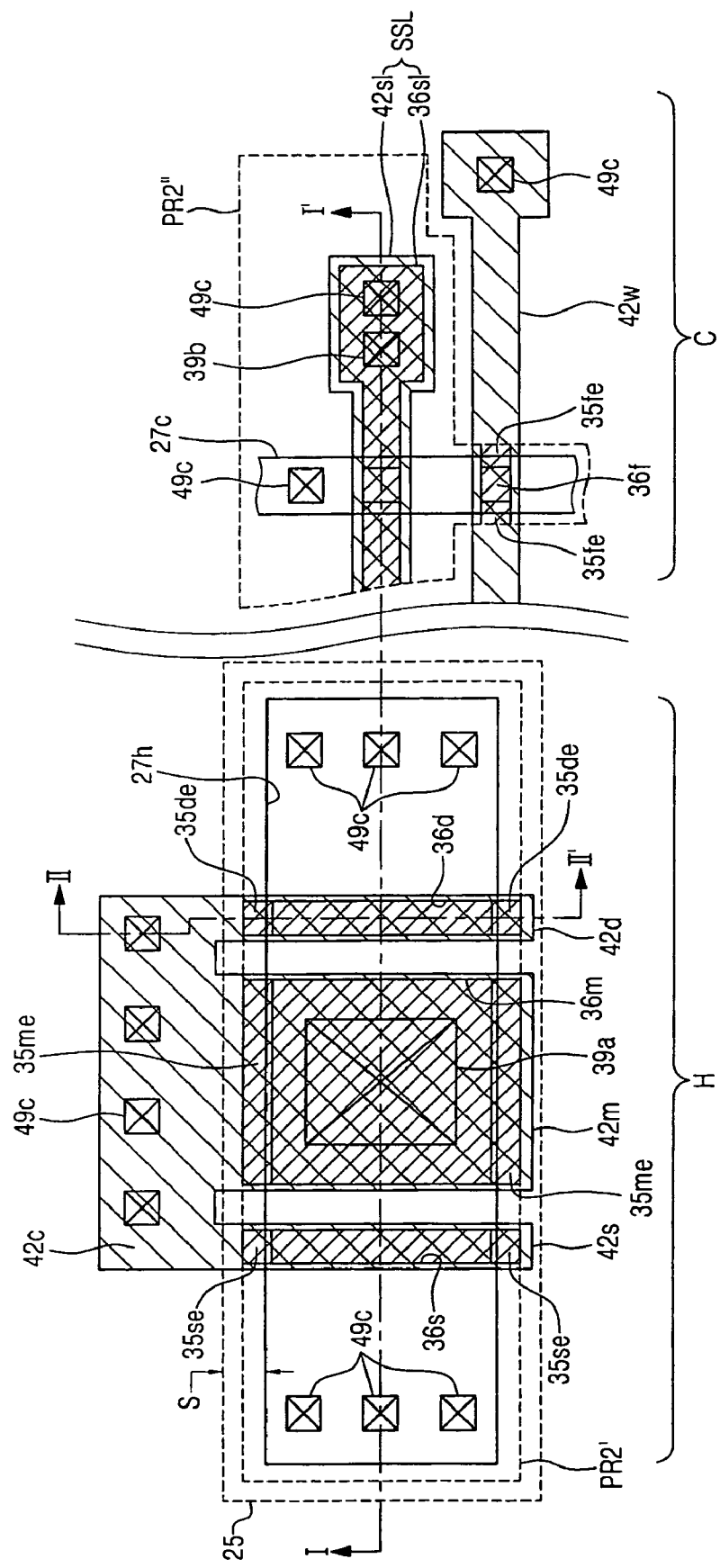

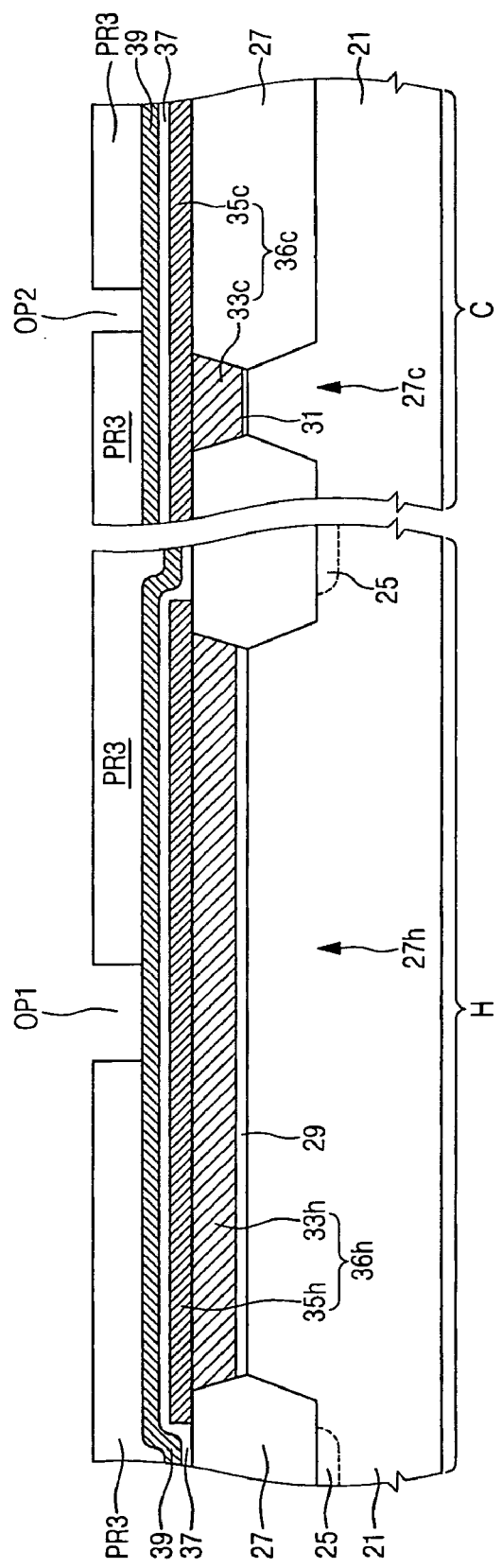

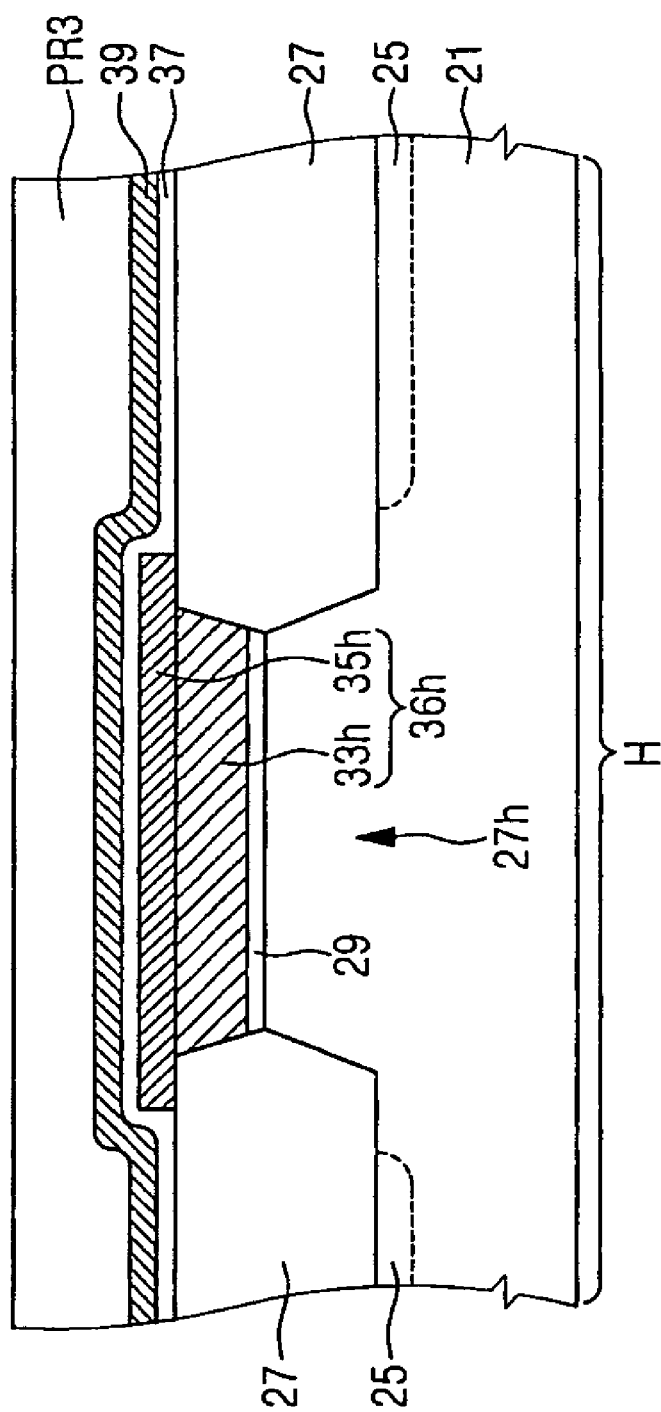

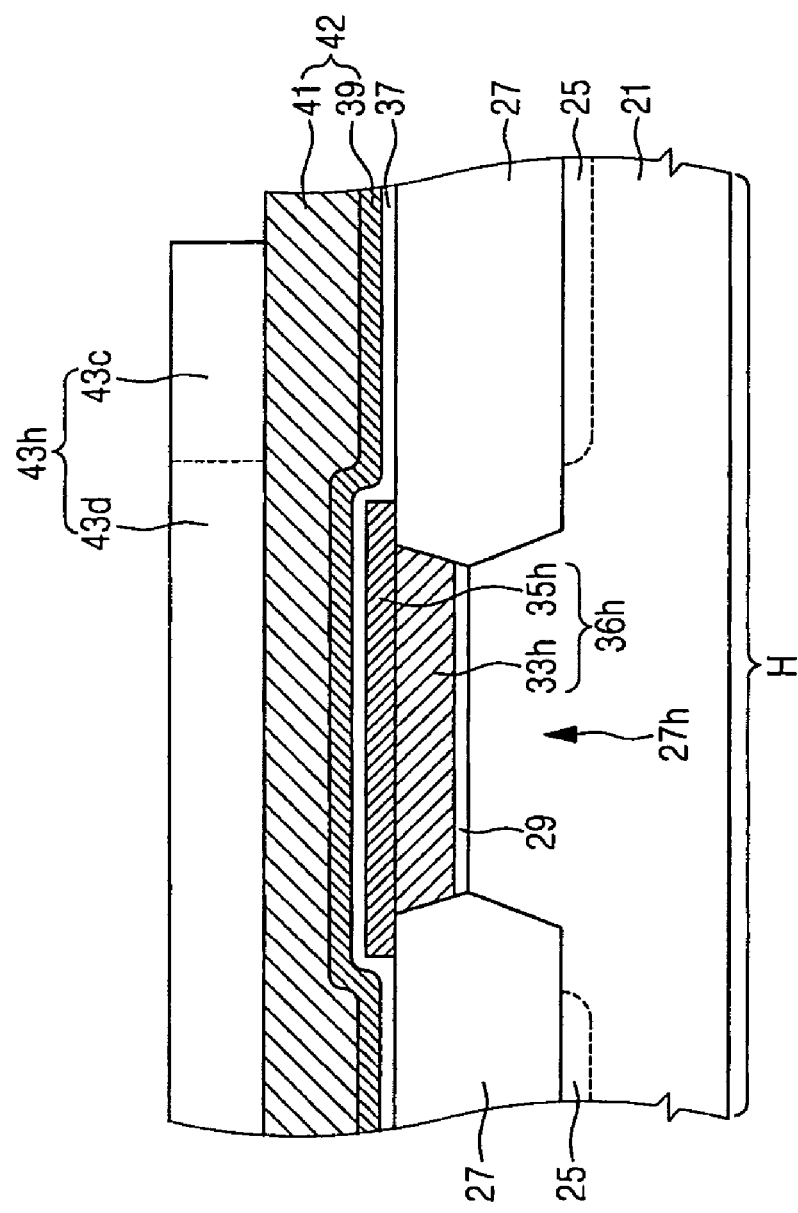

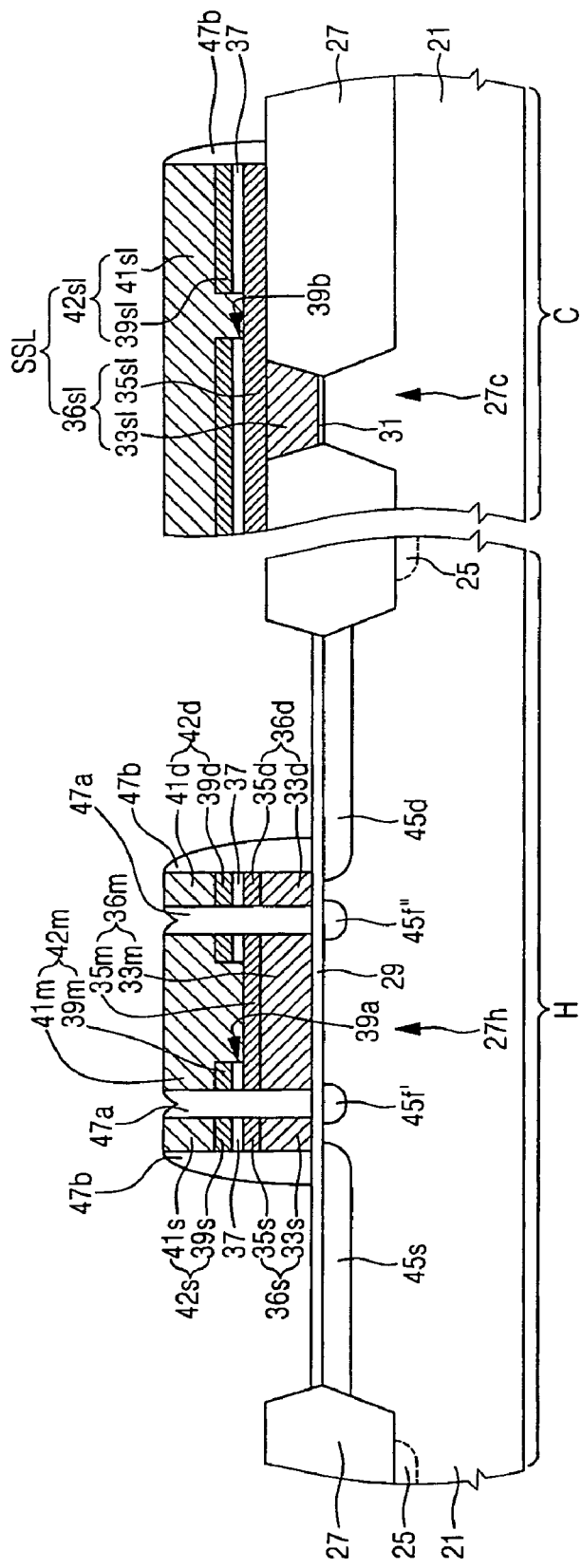

NONVOLATILE MEMORY DEVICES INCLUDING HIGH-VOLTAGE MOS TRANSISTORS WITH FLOATED DRAIN-SIDE AUXILIARY GATES AND METHODS OF FABRICATING THE SAME

CROSS-REFERENCE TO RELATED APPLICATION

This application claims the benefit of Korean Patent Application No. 10-2005-0088335, filed Sep. 22, 2005, the contents of which are hereby incorporated herein by reference in their entirety.

FIELD OF THE INVENTION

The present invention relates to semiconductor devices and methods of fabricating the same and, more particularly, to nonvolatile memory devices including high-voltage MOS transistors with floated drain-side auxiliary gates and methods of fabricating the same.

BACKGROUND OF THE INVENTION

Nonvolatile memory devices include a plurality of nonvolatile memory cells and peripheral circuits for driving the nonvolatile memory cells. The nonvolatile memory cells may be programmed or erased using a high voltage of about 10 to 20 V. Also, data stored in the nonvolatile memory cells may be read using a low voltage of about 5 V or lower. Thus, the peripheral circuits may include high-voltage MOS transistors used in the program and erase operations as well as low-voltage MOS transistors used in the read operation. In general, each of the nonvolatile memory cells adopts a stacked gate structure. The stacked gate structure includes a floating gate, an inter-gate dielectric layer and a control gate electrode, which are sequentially stacked.

As the nonvolatile memory devices become more highly integrated, the nonvolatile memory cells have been scaled down in size. Nevertheless, there may be a limitation in reducing the equivalent oxide thickness of the inter-gate dielectric layer. As a result, if the nonvolatile memory cells are shrunk in order to increase the integration density of the nonvolatile memory devices, the coupling ratio of the nonvolatile memory cells is decreased to make it difficult to lower the program and erase voltages. Therefore, it is difficult to scale down the high-voltage MOS transistors since the high-voltage MOS transistors should be designed to have a breakdown voltage higher than the program and erase voltages. The program and erase voltages may be directly related to the drain breakdown voltages of the high-voltage MOS transistors.

FIG. 1 is a cross-sectional view illustrating a conventional high-voltage MOS transistor.

Referring to FIG. 1, an isolation layer 3 is provided in a predetermined region of a semiconductor substrate 1 to define a high-voltage active region 3a. A source region 12s and a drain region 12d are provided in both ends of the high-voltage active region 3 a, respectively. A high-voltage gate electrode 7 is disposed over the substrate 1 between the source and drain regions 12s and 12d, and a high-voltage gate insulating layer 5 is interposed between the high-voltage gate electrode 7 and the substrate 1. The drain region 12d may include a heavily doped drain region 11d spaced apart from the high-voltage gate electrode 7 and a drain extension 9d extending from the heavily doped drain region 11d to be adjacent to the high-voltage gate electrode 7. Similarly, the source region 12s may include a heavily doped source region 11s spaced apart from the high-voltage gate electrode 7 and a source extension 9s extending from the heavily doped source region 11s to be adjacent to the high-voltage gate electrode 7. The source and drain extensions 9s and 9d have an impurity concentration lower than that of the heavily doped source and drain regions 11s and 11d.

When the high-voltage MOS transistor shown in FIG. 1 is an NMOS transistor, the high-voltage MOS transistor may be turned off by grounding the high-voltage gate electrode 7, the source region 12s and the semiconductor substrate 1 and applying a positive drain voltage $V_D$ to the drain region 12d. In this case, if the drain voltage $V_D$ increases, the drain extension 9d may be depleted. In addition, if the drain voltage $V_D$ further increases, a gate electric field $E_g$ between the high-voltage gate electrode 7 and the heavily doped drain region 11d increases. Increase of the gate electric field $E_g$ may causes drain leakage current $I_L$ corresponding to a band-to-band tunneling current that flows through a junction region between the heavily doped drain region 11d and the substrate 1. The drain leakage current $I_L$ is referred to as a gate induced drain leakage (GIDL) current. The GIDL current should be suppressed in order to improve the drain breakdown voltage of the high-voltage MOS transistor.

The GIDL current may be generated due to a high electric field between the high-voltage gate electrode 7 and the heavily doped drain region 11d. Accordingly, there is a need to increase a distance D between the high-voltage gate electrode 7 and the heavily doped drain region 11d in order to increase the drain breakdown voltage of the high-voltage MOS transistor. However, if the distance D between the high-voltage gate electrode 7 and the heavily doped drain region 11d increases, the area occupied by the high-voltage MOS transistor may also increase to degrade the integration density of a semiconductor device.

A MOS transistor for suppressing the GIDL current is disclosed in Korean Patent No. 10-0436287 to Suh, entitled "Transistor of Semiconductor Device and Method of Fabricating the Same". According to Suh, first and second auxiliary electrodes are provided at both sides of a gate electrode of a transistor, respectively. The first auxiliary electrode overlaps a source region, and the second auxiliary electrode overlaps a drain region. The gate electrode and the second auxiliary electrode are connected to first and second voltage supply sources, respectively. When a negative voltage is applied to the gate electrode in order to turn off the transistor, a voltage of 0 V is applied to the second auxiliary electrode so that a GIDL current flowing through a junction of the drain region can be suppressed.

SUMMARY OF THE INVENTION

An embodiment of the invention provides high-voltage MOS transistors, which are suitable for suppression of a GIDL current and improvement in integration density.

Another embodiment of the invention provides nonvolatile memory devices employing high-voltage MOS transistors which are suitable for suppression of a GIDL current and improvement in integration density.

Still another embodiment of the invention provides methods of fabricating a high-voltage MOS transistor, which is capable of suppressing a GIDL current and improving integration density.

In one aspect, the present invention is directed to high-voltage MOS transistors including a floated drain-side auxiliary gate for reducing an electric field between a main gate electrode and a drain region. The high-voltage MOS transistors include a source region and a drain region provided in a semiconductor substrate. A main gate electrode is disposed over the semiconductor substrate between the drain region and the source region and is electrically insulated from the semiconductor substrate. A lower drain-side auxiliary gate and an upper drain-side auxiliary gate are sequentially stacked over the semiconductor substrate between the main gate electrode and the drain region. The lower drain-side auxiliary gate is electrically insulated from the semiconductor substrate, the main gate electrode and the upper drain-side auxiliary gate.

In some embodiments of the present invention, the source region and the drain region may be N-type impurity regions or P-type impurity regions.

In other embodiments, the drain region may include a heavily doped drain region and a drain extension. The heavily doped drain region may be spaced apart from the lower drain-side auxiliary gate, and the drain extension may extend from the heavily doped drain region to be adjacent to the lower drain-side auxiliary gate. The drain extension may have a lower impurity concentration than the heavily doped drain region. A drain-side auxiliary impurity region may be provided in the semiconductor substrate under a gap region between the main gate electrode and the lower drain-side auxiliary gate. The drain-side auxiliary impurity region may have the same conductivity type and the same impurity concentration as the drain extension.

In still other embodiments, an inter-gate dielectric layer may be provided between the lower drain-side auxiliary gate and the upper drain-side auxiliary gate.

In yet other embodiments, the upper drain-side auxiliary gate may be electrically insulated from the main gate electrode.

In yet still other embodiments, a gate connection that extends from the main gate electrode may be provided to electrically connect the main gate electrode to the upper drain-side auxiliary gate.

In further embodiments, gap regions between the main gate electrode and the drain-side auxiliary gates may be filled with an insulating spacer pattern, and sidewalls of the drain-side auxiliary gates adjacent to the drain region may be covered with an insulating spacer.

In another aspect, a high-voltage MOS transistor according to the invention includes an isolation layer provided in a predetermined region of a semiconductor substrate to define an active region. A source region and a drain region are provided in the active region. A drain-side auxiliary impurity region is provided in the active region between the source region and the drain region. A main gate electrode is disposed over the active region between the drain-side auxiliary impurity region and the source region. The main gate electrode includes a lower main gate electrode and an upper main gate electrode which are electrically connected to each other. A drain-side auxiliary gate pattern is disposed over the active region between the drain-side auxiliary impurity region and the drain region. The drain-side auxiliary gate pattern includes a lower drain-side auxiliary gate, an upper drain-side auxiliary gate and an inter-gate dielectric layer interposed therebetween. A high-voltage gate insulating layer is provided between the main gate electrode and the active region as well as between the drain-side auxiliary gate pattern and the active region.

In still another aspect, the present invention is directed to a nonvolatile memory device employing a high-voltage MOS transistor that has a floated drain-side auxiliary gate. The nonvolatile memory device includes a semiconductor substrate having a first region and a second region. An isolation layer is provided in a predetermined region of the semiconductor substrate to define a high-voltage active region and a cell active region in the first and second regions, respectively. A source region and a drain region are provided in the high-voltage active region. A drain-side auxiliary impurity region is provided in the high-voltage active region between the source region and the drain region. A main gate electrode is disposed over the high-voltage active region between the drain-side auxiliary impurity region and the source region. The main gate electrode includes a lower main gate electrode and an upper main gate electrode that are electrically connected to each other. A drain-side auxiliary gate pattern is disposed over the high-voltage active region between the drain-side auxiliary impurity region and the drain region. The drain-side auxiliary gate pattern includes a lower drain-side auxiliary gate, an upper drain-side auxiliary gate and an inter-gate dielectric layer interposed therebetween. A high-voltage gate insulating layer is provided between the main gate electrode and the high-voltage active region as well as between the drain-side auxiliary gate pattern and the high-voltage active region. The lower drain-side auxiliary gate is electrically insulated from the main gate electrode and the upper drain-side auxiliary gate.

In yet another aspect, the present invention is directed to a method of fabricating a high-voltage MOS transistor having a floated drain-side auxiliary gate. The method includes forming an isolation layer in a predetermined region of a semiconductor substrate to define an active region. A high-voltage gate insulating layer is formed on the active region. A lower gate pattern is formed to cover the high-voltage gate insulating layer. An inter-gate dielectric layer is formed on the semiconductor substrate having the lower gate pattern. An upper gate conductive layer is formed on the inter-gate dielectric layer. The upper gate conductive layer is formed to contact the lower gate pattern through a gate via hole penetrating the inter-gate dielectric layer. The upper gate conductive layer, the inter-gate dielectric layer and the lower gate pattern are patterned, thereby forming at least a main gate electrode, a drain-side auxiliary gate pattern and a source-side auxiliary gate pattern that cross over the active region. The main gate electrode is formed to include a lower main gate electrode and an upper main gate electrode that are electrically connected to each other through the gate via hole, and the drain-side auxiliary gate pattern is formed to include a lower drain-side auxiliary gate and an upper drain-side auxiliary gate that are electrically insulated from each other by the inter-gate dielectric layer. The source-side auxiliary gate pattern is formed to include a lower source-side auxiliary gate and an upper source-side auxiliary gate electrically insulated from each other by the inter-gate dielectric layer.

In one embodiment, the method further comprises: implanting impurity ions into the active region using the main gate electrode, the drain-side auxiliary gate pattern and the source-side auxiliary gate pattern as ion implantation masks to form a drain extension, a source extension, a drain-side auxiliary impurity region and a source-side auxiliary impurity region, the drain extension being formed in the active region which is adjacent to the drain-side auxiliary gate pattern and located opposite the main gate electrode, the source extension being formed in the active region which is adjacent to the source-side auxiliary gate pattern and located opposite the main gate electrode, the drain-side auxiliary impurity region being formed in the active region under a gap region between the main gate electrode and the drain-side auxiliary gate pattern, and the source-side auxiliary impurity region being formed in the active region under a gap region between the main gate electrode and the source-side auxiliary gate pattern; and forming a heavily doped source region and a heavily doped drain region in the source extension and the drain extension, respectively. At least the heavily doped drain region is formed to be spaced apart from the drain-side auxiliary gate pattern.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 2 is a plan view illustrating a portion of a nonvolatile memory device including a high-voltage MOS transistor according to embodiments of the present invention.

FIGS. 5A, 6A, 7A, 8A, 9A and 10A are cross-sectional views taken along line I-I' of FIG. 2 to illustrate methods of fabricating a nonvolatile memory device including a high-voltage MOS transistor according to embodiments of the present invention.

FIGS. 5B, 6B, 7B, 8B, 9B and 10B are cross-sectional views taken along line II-II' of FIG. 2 to illustrate methods of fabricating a nonvolatile memory device including a high-voltage MOS transistor according to embodiments of the present invention.

DETAILED DESCRIPTION OF THE INVENTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. When a layer is described to be formed on other layer or on a substrate, the layer may be formed on the other layer or on the substrate, or a third layer may be interposed between the layer and the other layer or the substrate.

Figure 3A:
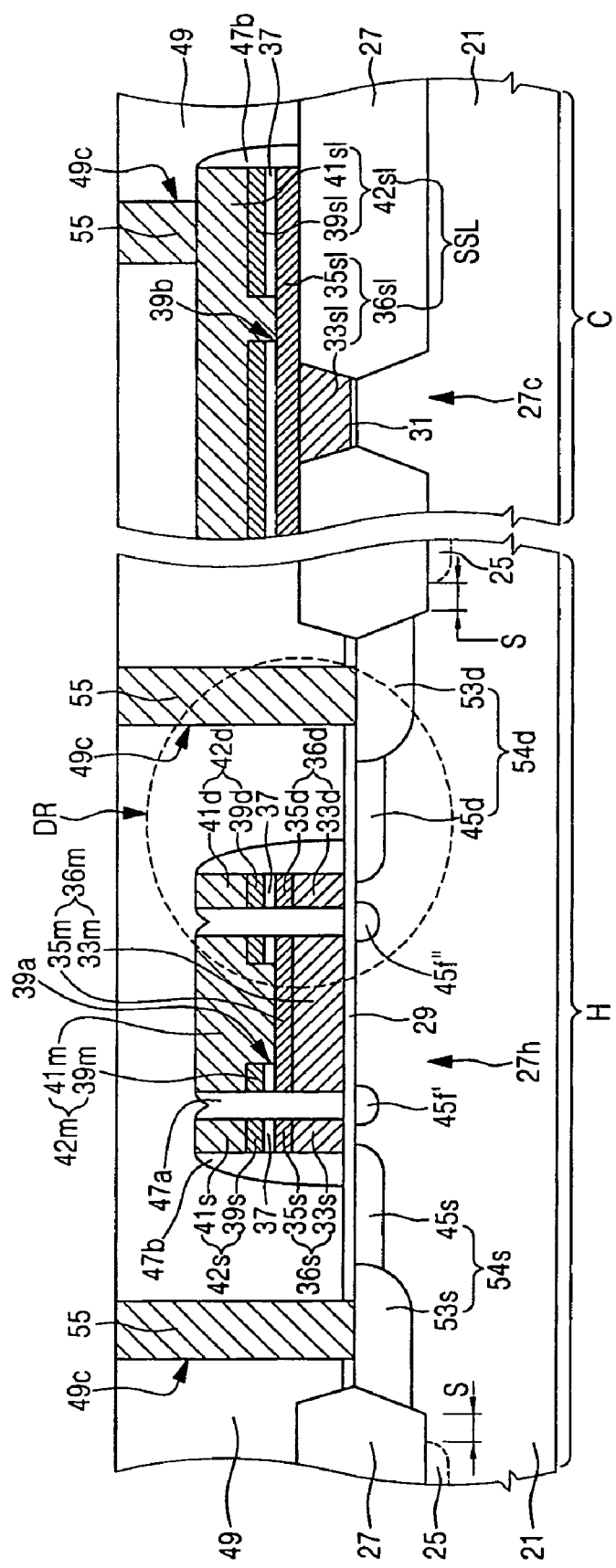
FIG. 3A is a cross-sectional view taken along line I-I' of FIG. 2 to illustrate a nonvolatile memory device including a high-voltage MOS transistor according to embodiments of the present invention.
Figure 3B:
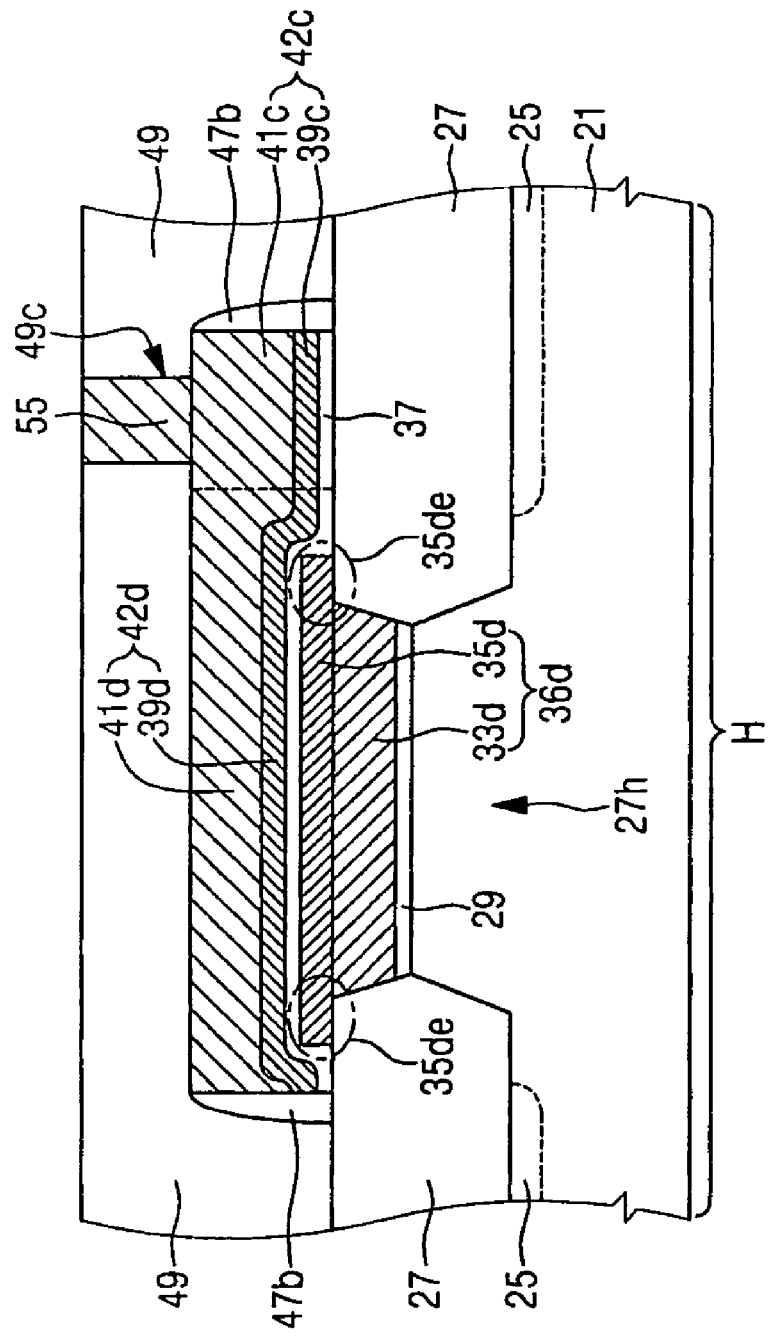
FIG. 3B is a cross-sectional view taken along line II-II' of FIG. 2 to illustrate a nonvolatile memory device including a high-voltage MOS transistor according to embodiments of the present invention.

FIG. 2 is a plan view illustrating a portion of a nonvolatile memory device including a high-voltage MOS transistor according to embodiments of the present invention, FIG. 3A is a cross-sectional view taken along line I-I' of FIG. 2, and FIG. 3B is a cross-sectional view taken along line II-II' of FIG. 2.

Referring to FIGS. 2, 3A and 3B, an isolation layer 27 is provided in a predetermined region of a semiconductor substrate 21 having a first region H and a second region C. The isolation layer 27 defines a high-voltage active region 27h and a cell active region 27c in the first and second regions H and C, respectively. A source region 54s and a drain region 54d are provided in the high-voltage active region 27h. The source and drain regions 54s and 54d are respectively provided in both ends of the high-voltage active region 27h to be in contact with the isolation layer 27. The source and drain regions 54s and 54d are impurity regions having a conductivity type different from that of the semiconductor substrate 21. For example, when the semiconductor substrate 21 is a P-type semiconductor substrate, the source and drain regions 54s and 54d may be N-type impurity regions. In contrast, when the semiconductor substrate 21 is an N-type semiconductor substrate, the source and drain regions 54s and 54d may be P-type impurity regions.

A channel stop impurity region 25 may be provided under the isolation layer 27 in the first region H. The channel stop impurity region 25 has the same conductivity type as the semiconductor substrate 21. For example, when the semiconductor substrate 21 is a P-type semiconductor substrate, the channel stop impurity region 25 may be a P-type impurity region. Further, the channel stop impurity region 25 may have an impurity concentration higher than that of the semiconductor substrate 21 in order to prevent a parasitic channel from being formed under the isolation layer 27 when a high voltage is applied to a conductive interconnection (not shown) disposed on the isolation layer 27 in the first region H. However, when the channel stop impurity region 25 is adjacent to the source and drain regions 54s and 54d, a junction breakdown voltage of the source and drain regions 54s and 54d may decrease. Therefore, the channel stop impurity region 25 may be spaced from an edge of the high-voltage active region 27h (i.e., the source and drain regions 54s and 54d) by a specific distance S. This is for preventing the junction breakdown voltage of the source and drain regions 54s and 54d from being reduced due to the channel stop impurity region 25, as described above.

A main gate electrode is disposed over the high-voltage active region 27h between the source and drain regions 54s and 54d, and a drain-side auxiliary gate pattern is provided over the high-voltage active region 27h between the main gate electrode and the drain region 54d. The main gate electrode and the drain-side auxiliary gate pattern may extend to cross over the high-voltage active region 27h. The drain-side auxiliary gate pattern includes a lower drain-side auxiliary gate 36d, an inter-gate dielectric layer 37 and an upper drain-side auxiliary gate 42d, which are sequentially stacked. The lower drain-side auxiliary gate 36d is electrically insulated from the upper drain-side auxiliary gate 42d by the inter-gate dielectric layer 37.

The main gate electrode may include a lower main gate electrode 36m and an upper main gate electrode 42m, which are sequentially stacked. The upper main gate electrode 42m is electrically connected to the lower main gate electrode 36m. The same insulating layer as the inter-gate dielectric layer 37 may be interposed between the lower and upper main gate electrodes 36m and 42m. In this case, the upper main gate electrode 42m may be electrically connected to the lower main gate electrode 36m through a gate via hole 39a penetrating the inter-gate dielectric layer 37.

The lower drain-side auxiliary gate 36d may include first and second lower drain-side auxiliary gates 33d and 35d, which are sequentially stacked. In this case, the first lower drain-side auxiliary gate 33d may be self-aligned to the high-voltage active region 27h as shown in FIG. 3B, and the second lower drain-side auxiliary gate 35d may include extensions 35de which extend to cover the isolation layer 27 adjacent to the high-voltage active region 27h. Similarly, the lower main gate electrode 36m may include first and second lower main gate electrodes 33m and 35m, which are sequentially stacked. In this case, the first lower main gate electrode 33m may be self-aligned to the high-voltage active region 27h, and the second lower main gate electrode 35m may include extensions 35me which extend to cover the isolation layer 27 adjacent to the high-voltage active region 27h. The first lower drain-side auxiliary gate 33d may be the same material layer as the first lower main gate electrode 33m, and the second lower drain-side auxiliary gate 35d may be the same material layer as the second lower main gate electrode 35m. That is, the lower drain-side auxiliary gate 36d may be the same material layer as the lower main gate electrode 36m.

In one embodiment of the present invention, the lower drain-side auxiliary gate 36d may be composed of only the first lower drain-side auxiliary gate 33d. In this case, the lower main gate electrode 36m may be composed of only the first lower main gate electrode 33m. Alternatively, the lower drain-side auxiliary gate 36d may be composed of only the second lower drain-side auxiliary gate 35d. In this case, the lower main gate electrode 36m may be composed of only the second lower main gate electrode 35m.

Furthermore, the upper drain-side auxiliary gate 42d may include first and second upper drain-side auxiliary gates 39d and 41d which are sequentially stacked, and the upper main gate electrode 42m may include first and second upper main gate electrodes 39m and 41m which are sequentially stacked. In this case, the second upper main gate electrode 41m may penetrate the first upper main gate electrode 39m and the inter-gate dielectric layer 37 to be in contact with the lower main gate electrode 36m. The first upper drain-side auxiliary gate 39d may be the same material layer as the first upper main gate electrode 39m, and the second upper drain-side auxiliary gate 41d may be the same material layer as the second upper main gate electrode 41m. That is, the upper drain-side auxiliary gate 42d may be the same material layer as the upper main gate electrode 42m.

In another embodiment of the present invention, the upper drain-side auxiliary gate 42d may be composed of only the second upper drain-side auxiliary gate 41d. In this case, the upper main gate electrode 42m may be composed of only the second upper main gate electrode 41m.

The lower main gate electrode 36m and the lower drain-side auxiliary gate 36d are electrically insulated from the high-voltage active region 27h by a high-voltage gate insulating layer 29.

The upper main gate electrode 42m may extend and be electrically connected to the upper drain-side auxiliary gate 42d. That is, the upper main gate electrode 42m may be electrically connected to the upper drain-side auxiliary gate 42d through a gate connection 42c. The gate connection 42c may be the same material layer as the upper main gate electrode 42m and the upper drain-side auxiliary gate 42d. Thus, when the upper main gate electrode 42m includes the first and second upper main gate electrodes 39m and 41m, the gate connection 42c may include first and second gate connections 39c and 41c which are extended from the first and second upper main gate electrodes 39m and 41m, respectively.

The drain region 54d may include a heavily doped drain region 53d which is spaced apart from the lower drain-side auxiliary gate 36d and a drain extension 45d which extends from the heavily doped drain region 53d to be adjacent to the lower drain-side auxiliary gate 36d. The drain extension 45d has an impurity concentration lower than the heavily doped drain region 53d. This is for increasing a junction breakdown voltage of the drain region 54d. Further, a drain-side auxiliary impurity region 45f" may be provided in the high-voltage active region 27h under a gap region between the lower drain-side auxiliary gate 36d and the 5 lower main gate electrode 36m. The drain-side auxiliary impurity region 45f" may have the same conductivity type and the same impurity concentration as the drain extension 53d.

In still another embodiment of the present invention, a source-side auxiliary gate pattern may be provided to cross over the high-voltage active region 27h between the lower main gate electrode 36m and the source region 54s. The source-side auxiliary gate pattern may have the same structure as the drain-side auxiliary gate pattern. That is, the source-side auxiliary gate pattern includes a lower source-side auxiliary gate 36s, an inter-gate dielectric layer 37 and an upper source-side auxiliary gate 42s which are sequentially stacked, and the lower 15 source-side auxiliary gate 36s is electrically insulated from the upper source-side auxiliary gate 42s by the inter-gate dielectric layer 37. Also, the lower source-side auxiliary gate 36s may include first and second lower source-side auxiliary gates 33s and 35s, which are sequentially stacked. In this case, the first lower source-side auxiliary gate 33s may be self-aligned to the high-voltage active region 27h like the first lower drain-side auxiliary gate 33d, and the second lower source-side auxiliary gate 35s may include extensions 35se which extend to cover the isolation layer 27 adjacent to the high-voltage active region 27h.

The first lower source-side auxiliary gate 33s may be the same material layer as the first lower main gate electrode 33m, and the second lower source-side auxiliary gate 35s may be the same material layer as the second lower main gate electrode 35m. That is, the lower source-side auxiliary gate 36s may be the same material layer as the lower main gate electrode 36m. For example, when the lower main gate electrode 36m is composed of only the first lower main gate electrode 33m, the lower source-side auxiliary gate 36s may be composed of only the first lower source-side auxiliary gate 33s. Alternatively, when the lower main gate electrode 36m is composed of only the second lower main gate electrode 35m, the lower source-side auxiliary gate 36s may be composed of only the second lower source-side auxiliary gate 35s.

Furthermore, the upper source-side auxiliary gate 42s may include first and second upper source-side auxiliary gates 39s and 41s, which are sequentially stacked. The first upper source-side auxiliary gate 39s may be the same material layer as the first upper main gate electrode 39m, and the second upper source-side auxiliary gate 41s may be the same material layer as the second upper main gate electrode 41m. That is, the upper source-side auxiliary gate 42s may be the same material layer as the upper main gate electrode 42m. For example, when the upper main gate electrode 42m is composed of only the second upper main gate electrode 41m, the upper source-side auxiliary gate 42s may be composed of only the second upper source-side auxiliary gate 41s.

The lower source-side auxiliary gate 36s is electrically insulated from the high-voltage active region 27h by the high-voltage gate insulating layer 29.

The gate connection 42c may extend and be electrically connected to the upper source-side auxiliary gate 42s. That is, the upper main gate electrode 42m may be electrically connected to the upper source-side auxiliary gate 42s through the gate connection 42c.

In yet another embodiment, when the source-side auxiliary gate pattern is provided, a source-side auxiliary impurity region 45f' may be provided in the high-voltage active region 27h under a gap region between the lower source-side auxiliary gate 36s and the lower main gate electrode 36m. The source-side auxiliary impurity region 45f' may have the same conductivity type and the same impurity concentration as the drain-side auxiliary impurity region 45f'.

The source region 54s may include a heavily doped source region 53s which is spaced apart from the lower source-side auxiliary gate 36s, and a source extension 45s which extends from the heavily doped source region 53s to be adjacent to the lower source-side auxiliary gate 36s. The source extension 45s has an impurity concentration lower than the heavily doped source region 53s.

In addition, gap regions between the main gate electrode and the auxiliary gate patterns may be filled with insulating spacer patterns 47a, and sidewalls of the auxiliary gate patterns adjacent to the source and drain regions 54s and 54d may be covered with insulating spacers 47b.

Furthermore, a selection line pattern SSL may be provided to cross over the cell active region 27c. The selection line pattern SSL may correspond to a string selection line pattern or a ground selection line pattern of a nonvolatile memory device (e.g., a NAND-type flash memory device). The selection line pattern SSL may include a selection line 42sl crossing over the cell active region 27c and a selection gate electrode 36sl interposed between the selection line 42sl and the cell active region 27c. The inter-gate dielectric layer 37 may be interposed between the selection line 42sl and the selection gate electrode 36sl. In this case, the selection line 42sl may be electrically connected to the selection gate electrode 36sl through a cell via hole 39b penetrating the inter-gate dielectric layer 37.

A selection gate insulating layer 31 may be provided between the selection gate electrode 36sl and the cell active region 27c. The selection gate insulating layer 31 may be thinner than the high-voltage gate insulating layer 29.

The selection gate electrode 36sl may include an upper selection gate electrode 35sl and a lower selection gate electrode 33sl. The upper selection gate electrode 35sl overlaps the selection line 42sl, and the lower selection gate electrode 33sl is interposed between the upper selection gate electrode 35sl and the cell active region 27c. In this case, the lower selection gate electrode 33sl may be self-aligned with the cell active region 27c.

The selection gate electrode 36sl may be the same material layer as the lower main gate electrode 36m. For example, when the lower main gate electrode 36m is composed of only the first lower main gate electrode 33m, the selection gate electrode 36sl may be composed of only the lower selection gate electrode 33sl. In this case, the cell via hole 39b may be disposed over the cell active region 27c. Alternatively, when the lower main gate electrode 36m is composed of only the second lower main gate electrode 35m, the selection gate electrode 36sl may be composed of only the upper selection gate electrode 35sl.

In yet still another embodiment, the selection line 42sl may include a lower selection line 39sl and an upper selection line 41sl, which are sequentially stacked. In this case, the upper selection line 41sl may penetrate the lower selection line 39sl and the inter-gate dielectric layer 37 to be in contact with the selection gate electrode 36sl. The selection line 42sl may be the same material layer as the upper main gate electrode 42m. That is, when the upper main gate electrode 42m is composed of only the second upper main gate electrode 41m, the selection line 42sl may be composed of only the upper selection line 41sl.

Sidewalls of the selection line pattern SSL also may be covered with the insulating spacers 47b. An interlayer insulating layer 49 is provided on the substrate 21 having the main gate electrode, the auxiliary gate patterns, the selection line pattern SSL and the spacers 47a and 47b. The gate connection 42d, the heavily doped source region 53s, the heavily doped drain region 53d and the selection line 42sl may be exposed by contact holes 49c that penetrate the interlayer insulating layer 49, and the contact holes 49c may be filled with conductive contact plugs 55.

Figure 4A:
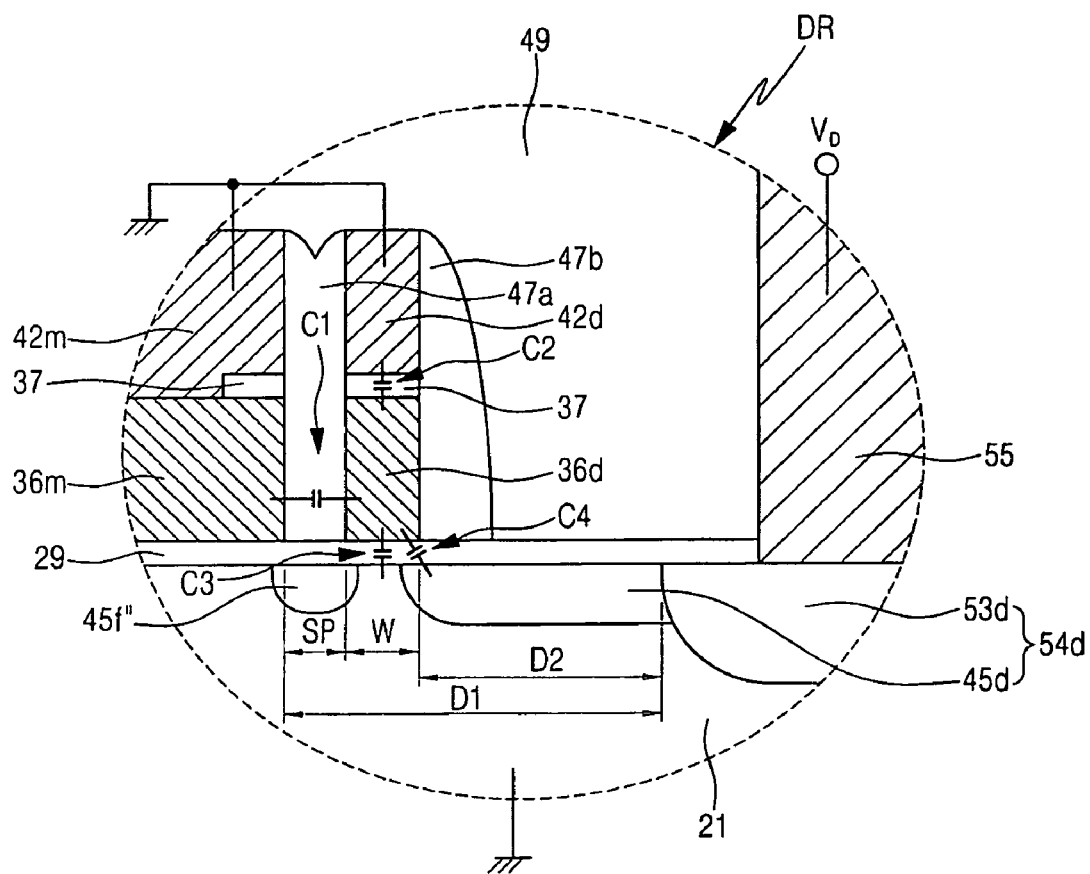
FIG. 4A is an enlarged cross-sectional view illustrating a drain region and a gate structure adjacent thereto shown in FIG. 3A.
Figure 4B:
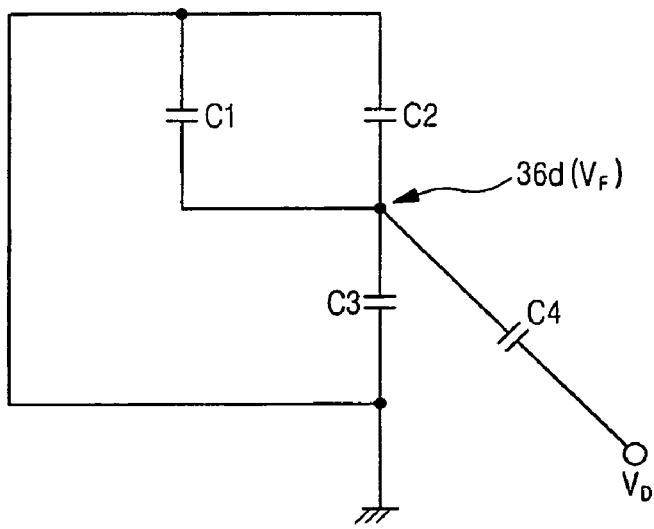
FIG. 4B is an equivalent circuit diagram illustrating a coupling ratio between the drain region and the gate structure shown in FIG. 4A.

FIG. 4A is an enlarged cross-sectional view illustrating a drain-side region DR of the high-voltage MOS transistor shown in FIG. 3A, and FIG. 4B is an equivalent circuit diagram of the drain-side region DR shown in FIG. 4A. In FIGS. 4A and 4B, it is assumed that the upper drain-side auxiliary gate 42d is electrically connected to the upper main gate electrode 42m as described with reference to FIGS. 2, 3A and 3B.

Referring to FIGS. 4A and 4B, a first parasitic capacitor C1 is provided between the lower main gate electrode 36m and the lower drain-side auxiliary gate 36d, and a second parasitic capacitor C2 is provided between the upper drain-side auxiliary gate 42d and the lower drain-side auxiliary gate 36d. Also, a third parasitic capacitor C3 is provided between the lower drain-side auxiliary gate 36d and the semiconductor substrate 21, and a fourth parasitic capacitor C4 is provided between the lower drain-side auxiliary gate 36d and the drain region 54d. The first parasitic capacitor C1 corresponds to a capacitor that the insulating spacer pattern 47a between the lower main gate electrode 36m and the lower drain-side auxiliary gate 36d acts as a dielectric layer, and the second parasitic capacitor C2 corresponds to a capacitor that the inter-gate dielectric layer 37 between the upper drain-side auxiliary gate 42d and the lower drain-side auxiliary gate 36d acts as a dielectric layer. Also, the third parasitic capacitor C3 corresponds to a capacitor that the high-voltage gate insulating layer 29 between the lower drain-side auxiliary gate 36d and the semiconductor substrate 21 acts as a dielectric layer, and the fourth parasitic capacitor C4 corresponds to a capacitor that the high-voltage gate insulating layer 29 between the lower drain-side auxiliary gate 36d and the drain region 54d acts as a dielectric layer.

The high-voltage MOS transistors according to the present embodiments adopt the lower drain-side auxiliary gate 36d, i.e., a floated drain-side auxiliary gate, as shown in FIG. 4A. Thus, an electric field between the lower drain-side auxiliary gate 36d and the drain region 54d corresponds to a actual gate electric field that causes the GIDL current.

The high-voltage MOS transistor shown in FIGS. 3A and 4A may be turned off by applying a ground voltage to the upper main gate electrode 42m, the source region 54s and the semiconductor substrate 21 and applying a drain voltage $V_D$ to the drain region 54d. In this case, a node voltage $V_F$ induced at the lower drain-side auxiliary gate 36d can be expressed by the following equation 1.

$$V_F = k \times V_D \qquad \text{(equation 1)}$$

wherein, "k" denotes a drain coupling ratio. The drain coupling ratio "k" may be expressed by the following equation 2.

$$k = F4 \div (F1 + F2 + F3 + F4) \qquad \text{(equation 2)}$$

wherein, "F1", "F2", "F3" and "F4" denote capacitances of the first to fourth parasitic capacitors C1, C2, C3 and C4, respectively.

As can be seen from the equations 1 and 2, the node voltage $V_F$ induced at the lower drain-side auxiliary gate 36d may be a voltage between the drain voltage $V_D$ and the ground voltage. As a result, even if a first distance D1 between the heavily doped drain region 53d and the main gate electrode is equal to the distance D between the gate electrode 7 and the heavily doped drain region 11d of the conventional high-voltage MOS transistor shown in FIG. 1, a gate electric field between the lower drain-side auxiliary gate 36d and the drain region 54d may be lower than the gate electric field between the gate electrode 7 and the drain region 12d of the conventional high-voltage MOS transistor shown in FIG. 1.

In addition, if the drain voltage $V_D$ further increases, the drain extension 45d may be depleted. In this case, the heavily doped drain region 53d actually serves as a drain region. Thus, the gate electric field which affects the GIDL current may be determined by a second distance D2 between the lower drain-side auxiliary gate 36d and the heavily doped drain region 53d as well as a voltage difference therebetween. In this case, if the first distance D1 is equal to the distance D between the gate electrode 7 and the heavily doped drain region 11d of the conventional high-voltage MOS transistor shown in FIG. 1, the second distance D2 may be less than the distance D between the gate electrode 7 and the heavily doped drain region 11d of the conventional high-voltage MOS transistor. Thus, a ratio of a difference between the drain voltage $V_D$ and the node voltage $V_F$ to the drain voltage $V_D$ should be less than a ratio of the second distance D2 to the first distance D1 in order to improve a drain breakdown voltage related to the GIDL current of the high-voltage MOS transistor according to the present embodiment. For example, when the drain voltage $V_D$ is 18V and the first and second distances D1 and D2 are 0.6 μm and 0.4 μm respectively, the node voltage $V_F$ induced at the lower drain-side auxiliary gate 36d should be higher than 6 V.

As can be seen from the equations 1 and 2, the node voltage $V_F$ may be determined by the drain coupling ratio k which is expressed using the first through fourth parasitic capacitances F1, F2, F3 and F4. Therefore, in the present embodiment, it is required to increase the drain coupling ratio k in order to suppress the GIDL current of the high-voltage MOS transistor. That is, at least one of the first through third parasitic capacitances F1, F2 and F3 should be relatively reduced as compared to the fourth parasitic capacitance F4. For example, in the event that the first and second distances D1 and D2 are given to have specific constant values, the drain coupling ratio "k" may be increased by increasing a distance SP between the lower main gate electrode 36m and the lower drain-side auxiliary gate 36d and reducing a width W of the lower drain-side auxiliary gate 36d. As a result, according to the present embodiment, it is possible to increase the drain coupling ratio "k" without increase of the first distance D1. This is because the lower drain-side auxiliary gate 36d is floated. That is, according to the present embodiment, the drain breakdown voltage can be increased by suppressing the GIDL current without degradation of the integration density.

Methods of fabricating the nonvolatile memory device shown in FIGS. 2, 3A and 3B will now be described.

FIGS. 5A, 6A, 7A, 8A, 9A and 10A are cross-sectional views taken along line I-I' of FIG. 2 to illustrate methods of fabricating a nonvolatile memory device including a high-voltage MOS transistor according to embodiments of the present invention, and FIGS. 5B, 6B, 7B, 8B, 9B and 10B are cross-sectional views taken along line II-II' of FIG. 2 to illustrate methods of fabricating a nonvolatile memory device including a high-voltage MOS transistor according to embodiments of the present invention.

Figure 5A:
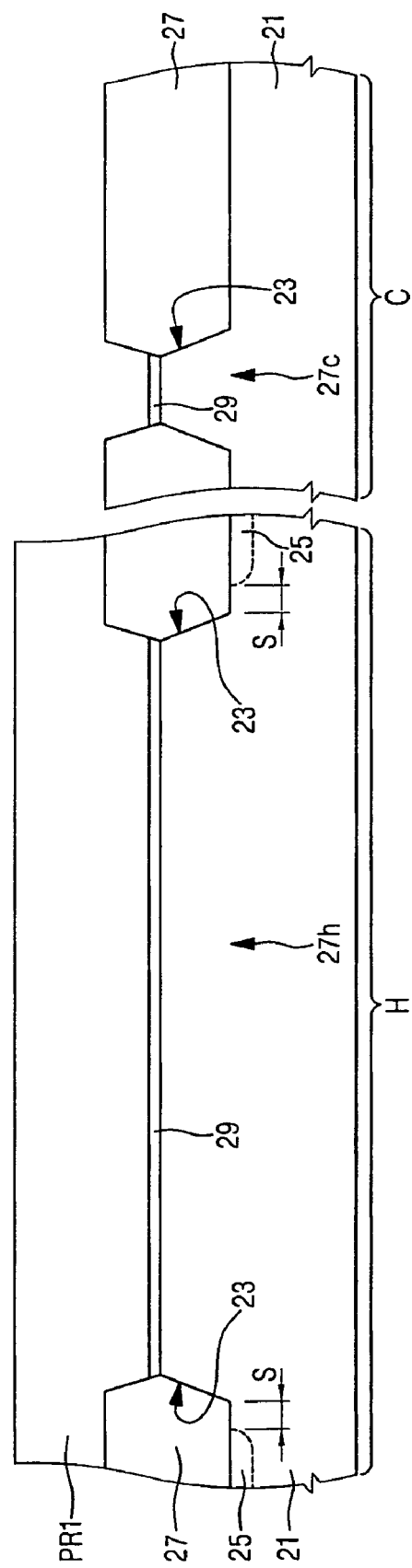
Figure 5B:
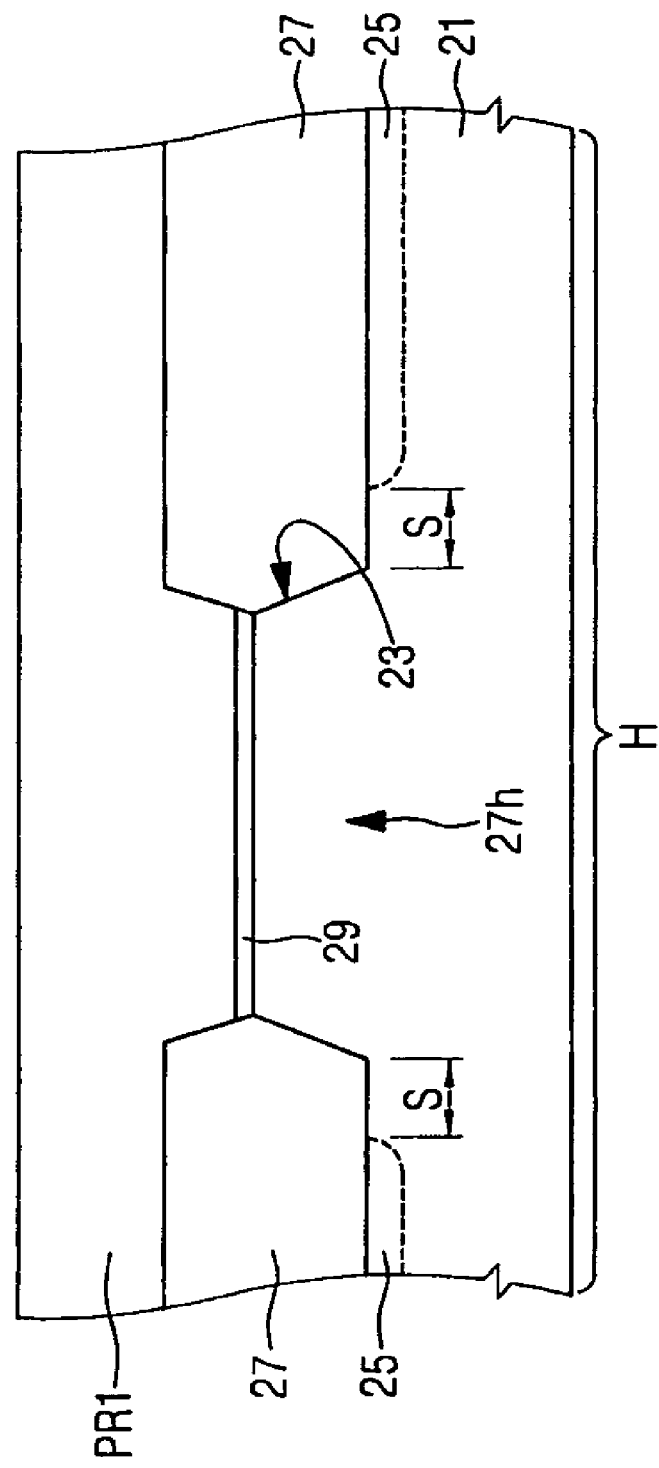

Referring to FIGS. 5A and 5B, a semiconductor substrate 21 having a first region H and a second region C is provided. The first and second regions H and C may correspond to a high-voltage MOS transistor region and a nonvolatile memory cell array region, respectively. An isolation layer 27 is formed in a predetermined region of the semiconductor substrate 21 to define a high-voltage active region 27h and a cell active region 27c in the first and second regions H and C, respectively. The isolation layer 27 may be formed using a conventional isolation technique well known in the art. For example, the isolation layer 27 may be formed using a conventional trench isolation technique. In this case, formation of the isolation layer 27 may comprise forming a trench region 23 in a predetermined region of the semiconductor substrate 21 and filling the trench region 23 with an insulating layer. Also, the isolation layer 27 may have a higher top surface than the active regions 27h and 27c.

Impurity ions having the same conductivity type as the semiconductor substrate 21 may be implanted into the semiconductor substrate 21 below the isolation layer 27 in the first region H, thereby forming a channel stop impurity region 25. The channel stop impurity region 25 may be formed before or after formation of the isolation layer 27. The channel stop impurity region 25 may be formed to be spaced apart from an edge of the high-voltage active region 27h by a specific distance S. This is for improving a junction breakdown voltage of source and drain regions to be formed in the high-voltage active region 27h in a subsequent process.

A high-voltage gate insulating layer 29 is formed on the high-voltage active region 27h and the cell active region 27c. The high-voltage gate insulating layer 29 may be formed of a thermal oxide layer having a thickness of several hundred Å. A first photoresist pattern PR1 is formed on the semiconductor substrate 21 having the high-voltage gate insulating layer 29. The first photoresist pattern PR1 may be formed to cover the first region H.

Figure 6A:
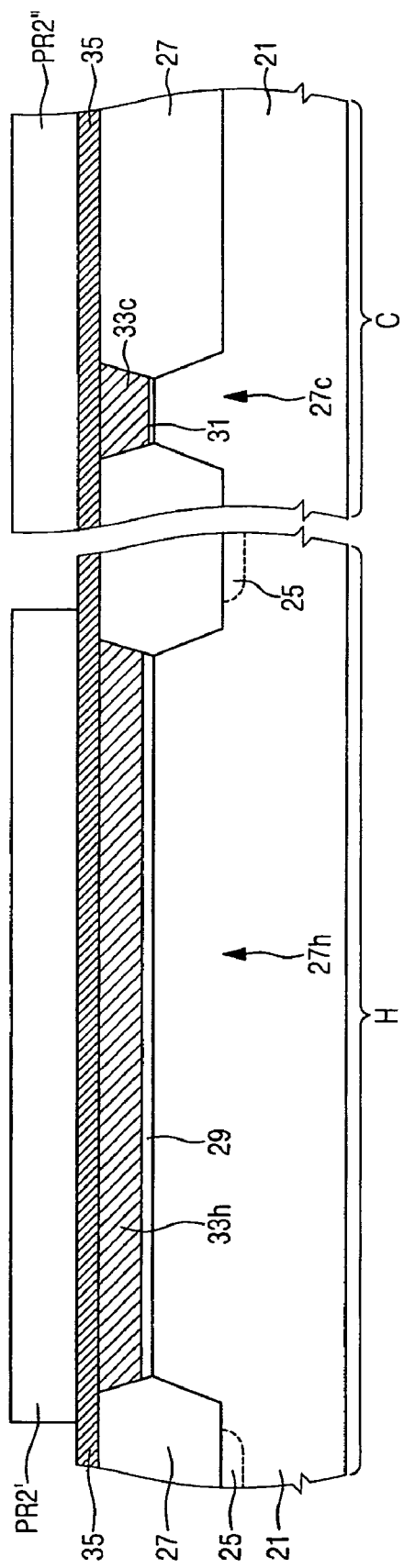
Figure 6B:
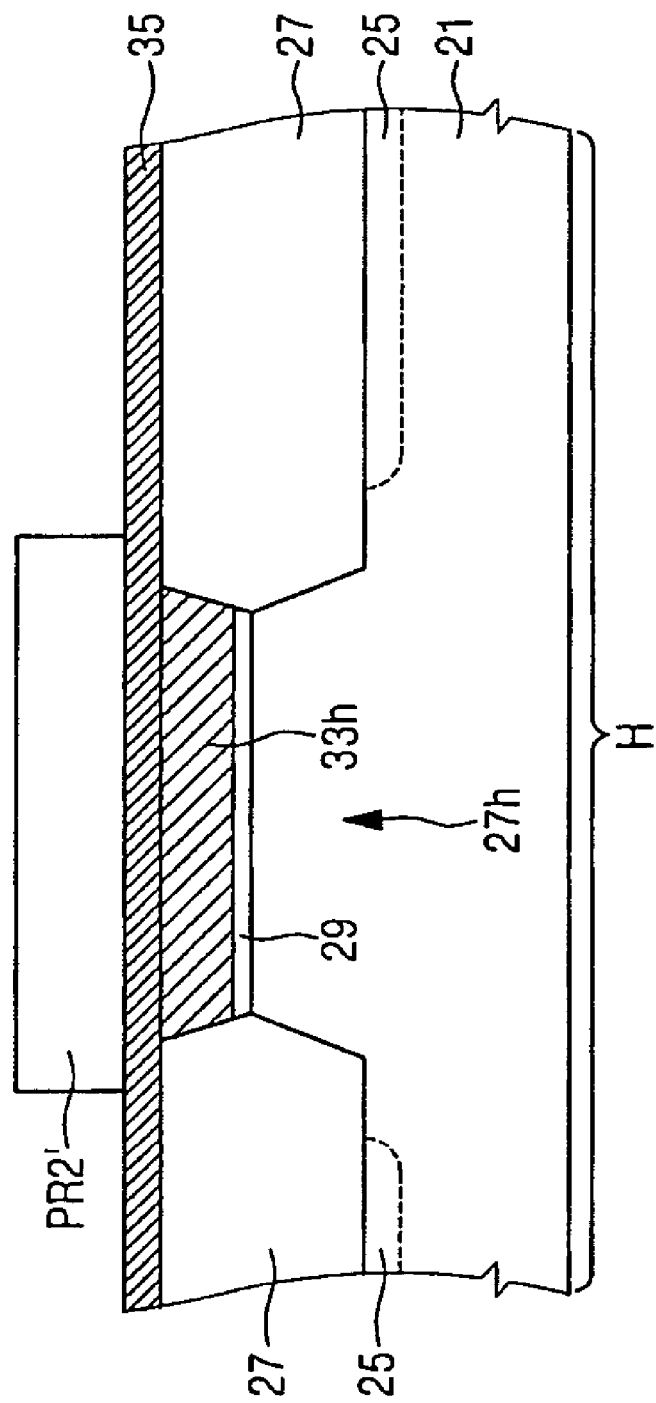

Referring to FIGS. 6A and 6B, the high-voltage gate insulating layer 29 on the cell active region 27c is selectively removed using the first photoresist pattern PR1 as an etch mask. The first photoresist pattern PR1 is then removed, and a selection gate insulating layer 31, for example, a tunnel insulating layer is formed on the cell active region 27c. The selection gate insulating layer 31 may be formed of a thin thermal oxide layer having a thickness of several tens Å.

A first lower gate conductive layer is formed on the substrate 21 having the selection gate insulating layer 31 and the first lower gate conductive layer is then planarized to expose a top surface of the isolation layer 27. As a result, a first lower gate pattern 33h self-aligned with the high-voltage active region 27h is formed on the high-voltage gate insulating layer 29, and a lower selection gate pattern 33c self-aligned with the cell active region 27c is formed on the selection gate insulating layer 31. The first lower gate conductive layer may be formed of a polysilicon layer.

A second lower gate conductive layer 35 is formed on the substrate 21 having the first lower gate pattern 33h and the lower selection gate pattern 33c. The second lower gate conductive layer 35 may also be formed of a polysilicon layer. A second photoresist pattern is formed on the second lower gate conductive layer 35. The second photoresist pattern may be formed to include a photoresist pattern PR2' covering the high-voltage active region 27h and a photoresist pattern PR2" covering the cell active region 27c. In this case, the photoresist pattern PR2" covering the cell active region 27c may extend to cover a portion of the isolation layer 27 adjacent to the cell active region 27c, as shown in FIGS. 2 and 6A.

In one embodiment, the process of forming the second lower gate conductive layer 35 may be omitted. In this case, the process of forming the second photoresist pattern PR2' and PR2" also may be omitted.

In another embodiment, the process of forming the first lower gate pattern 33h and the lower selection gate pattern 33c may be omitted. In this case, the second lower gate conductive layer 35 and the second photoresist patterns PR2' and PR2" may be formed on the substrate 21 having the selection gate insulating layer 31.

Referring to FIGS. 7A and 7B, the second lower gate conductive layer 35 is etched using the second photoresist patterns PR2' and PR2" as etch masks. As a result, a second lower gate pattern 35h is formed to cover the high-voltage active 15 region 27h, and an upper selection gate pattern 35c is formed to cover the cell active region 27c. The first lower gate pattern 33h and the second lower gate, pattern 35h constitute a lower gate pattern 36h, and the lower selection gate pattern 33c and the upper selection gate pattern 35c constitute a selection gate pattern 36c.

Subsequently, the second photoresist patterns PR2' and PR2" are removed. An inter-gate dielectric layer 37 is formed on the substrate 21 where the second photoresist patterns PR2' and PR2" are removed, and a third photoresist pattern PR3 is formed on the inter-gate dielectric layer 37. The third photoresist pattern PR3 may be formed to have a first opening OP1 and a second opening OP2 which are located over the lower gate pattern 36h and the selection gate pattern 36c, respectively. The inter-gate dielectric layer 37 may be formed of a combination layer of an oxide layer and a nitride layer, for example, an oxide/nitride/oxide (ONO) layer.

In still another embodiment of the present invention, a first upper gate conductive layer 39 may be formed on the inter-gate dielectric layer 37 prior to formation of the third photoresist pattern PR3. In this case, the first upper gate conductive layer 39 prevents the inter-gate dielectric layer 37 from being in direct contact with the third photoresist pattern PR3. Accordingly, the first upper gate conductive layer 39 can prevent the inter-gate dielectric layer 37 from being contaminated by the third photoresist pattern PR3. The first upper gate conductive layer 39 may be formed of a polysilicon layer.

As described above, when the process of forming the second lower gate conductive layer 35 is omitted, the third photoresist pattern PR3 may be formed so that the second opening OP2 is disposed over the lower selection gate pattern 33c.

Figure 8A:
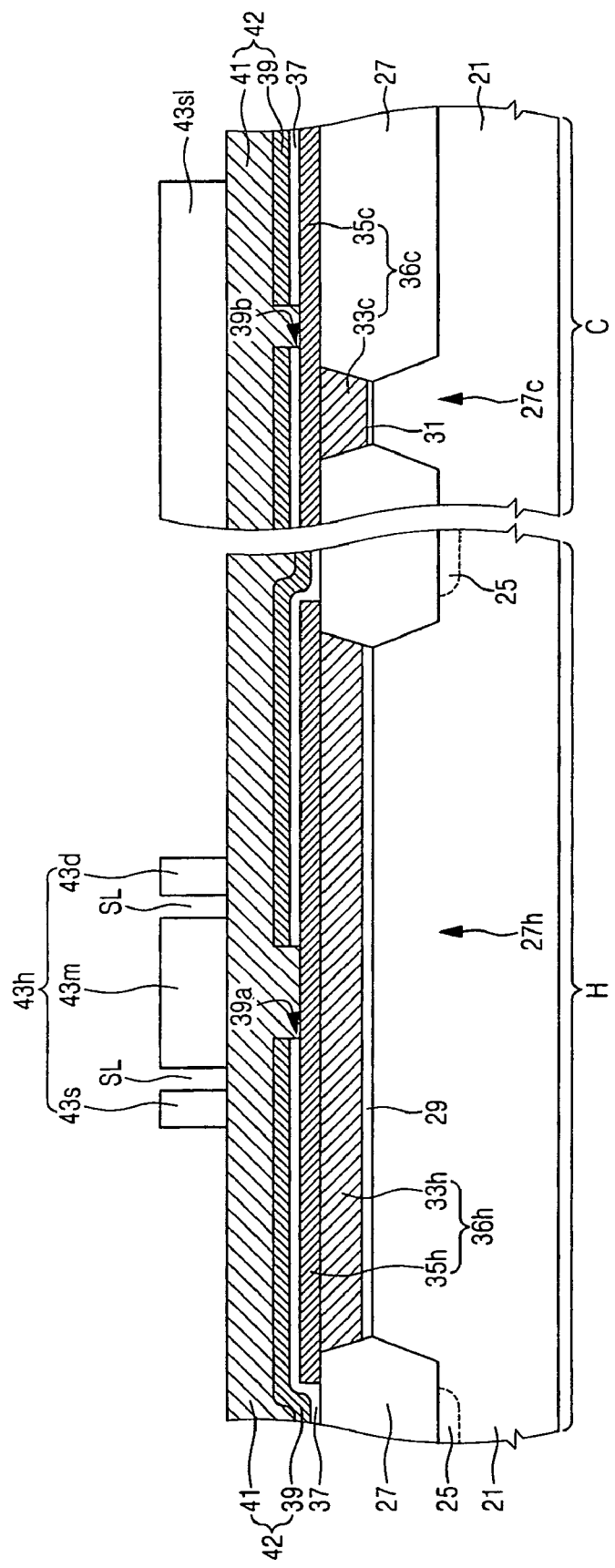

Referring to FIGS. 8A and 8B, the first upper gate conductive layer 39 and the inter-gate dielectric layer 37 are etched using the third photoresist pattern PR3 as an etch mask, thereby forming a gate via hole 39a and a cell via hole 39b that expose the lower gate pattern 36h and the selection gate pattern 36c, respectively. The third photoresist pattern PR3 is then removed, and a second upper gate conductive layer 41 is formed on the substrate 21 having the via holes 39a and 39b. The second upper gate conductive layer 41 may be formed of a polysilicon layer or a metal silicide layer. The first and second upper gate conductive layers 39 and 41 constitute an upper gate conductive layer 42.

A fourth photoresist pattern is formed on the upper gate conductive layer 42. The fourth photoresist pattern may be formed to include a first pattern 43h and a second pattern 43sl. The first and second patterns 43h and 43sl may be formed to cross over the high-voltage active region 27h and the cell active region 27c, respectively. In addition, the fourth photoresist pattern may further include a third pattern (not shown) that is adjacent to the second pattern 43sl and crosses over the cell active region 27c. The first pattern 43h may include a main pattern 43rr and a drain-side auxiliary pattern 43d, which cross the high-voltage active region 27h. Also, the first pattern 43h may further include a source-side auxiliary pattern 43s, which is adjacent to the main pattern 43m and located opposite the drain-side auxiliary pattern 43d. The source-side auxiliary pattern 43s is also formed across the high-voltage active region 27h. As a result, slit-shaped openings SL may be provided between the main pattern 43m and the auxiliary patterns 43s and 43d.

The first pattern 43h may further include a connection pattern 43c, which connects the main pattern 43m to the drain-side auxiliary pattern 43d. The connection pattern 43c may extend to be in contact with the source-side auxiliary pattern 43s. The connection pattern 43c may be disposed over the isolation layer 27 adjacent to the high-voltage active region 27h, as shown in FIG. 8B.

The main pattern 43m is formed to cover the gate via hole 39a, and the second pattern 43sl is formed to cover the cell via hole 39b.

Figure 9B:
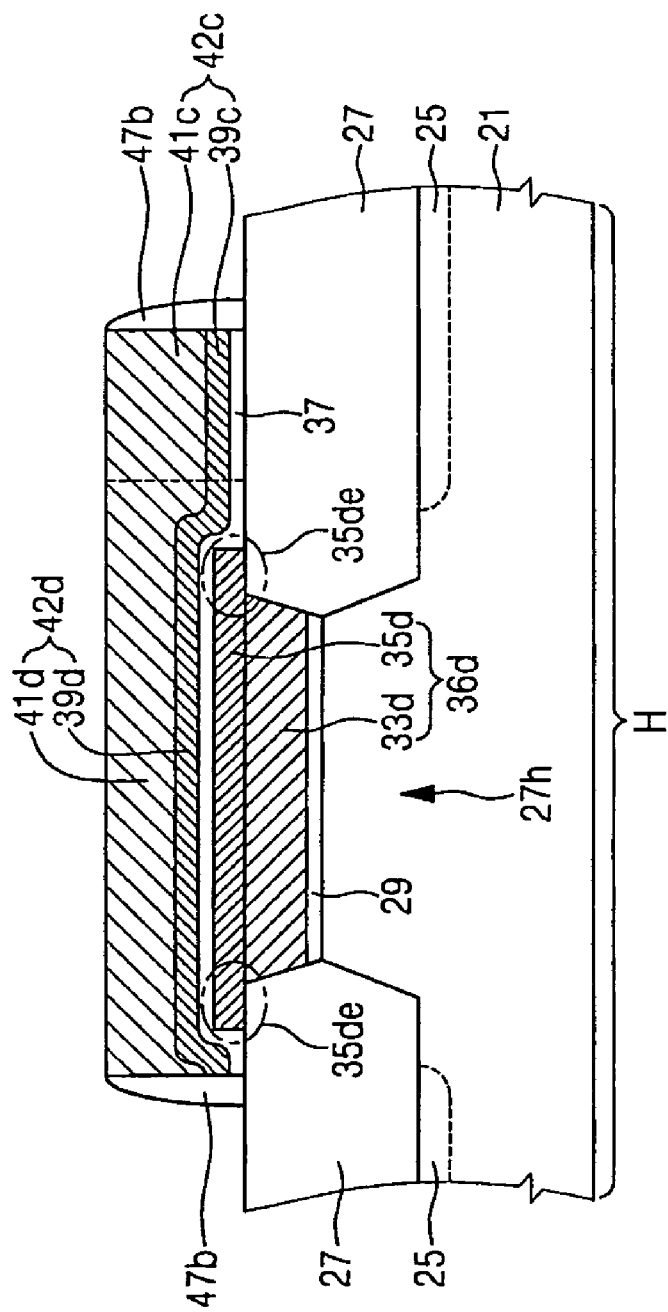

Referring to FIGS. 9A and 9B, the upper gate conductive layer 42, the inter-gate dielectric layer 37, the lower gate pattern 36h and the selection gate pattern 36c are etched using the fourth photoresist pattern 43h and 43sl as etch masks. Thus, a main gate electrode, a drain-side auxiliary gate pattern and a source-side auxiliary gate pattern are formed to cross over the high-voltage active region 27h, and a selection line pattern SSL is formed to cross over the cell active region 27c.

The drain-side auxiliary gate pattern may be formed to include a lower drain-side auxiliary gate 36d and an upper drain-side auxiliary gate 42d which are sequentially stacked, and the inter-gate dielectric layer 37 is interposed between the lower drain-side auxiliary gate 36d and the upper drain-side auxiliary gate 42d. Thus, the lower drain-side auxiliary gate 36d is electrically insulated from the upper drain-side auxiliary gate 42d by the inter-gate dielectric layer 37. Further, the lower drain-side auxiliary gate 36d may be formed to include a first lower drain-side auxiliary gate 33d and a second lower drain-side auxiliary gate 35d which are sequentially stacked, and the upper drain-side auxiliary gate 42d may be formed to include a first upper drain-side auxiliary gate 39d and a second upper drain-side auxiliary gate 41d which are sequentially stacked. The second lower drain-side auxiliary gate 35d may be formed to include extensions 35de covering the isolation layer 27.

The main gate electrode is formed to have a lower main gate electrode 36m and an upper main gate electrode 42m which are sequentially stacked. The inter-gate dielectric layer 37 may be interposed between the lower main gate electrode 36m and the upper main gate electrode 42m. Also, the upper main gate electrode 36m is electrically connected to the lower main gate electrode 36m through the gate via hole 39a penetrating the inter-gate dielectric layer 37. In more detail, the lower main gate electrode 36m may be formed to include a first lower main gate electrode 33m and a second lower main gate electrode 35m which are sequentially stacked, and the upper main gate electrode 42m may be formed to include a first upper main gate electrode 39m and a second upper main gate electrode 41m which are sequentially stacked. The second lower main gate electrode 35m may be formed to have extensions (35me of FIG. 2) covering the isolation layer 27.

The source-side auxiliary gate pattern is also formed to include a lower source-side auxiliary gate 36s and an upper source-side auxiliary gate 42s which are sequentially stacked, and the inter-gate dielectric layer 37 is interposed between the lower source-side auxiliary gate 36s and the upper source-side auxiliary gate 42s. The lower source-side auxiliary gate 36s may be electrically insulated from the upper source-side auxiliary gate 42s by the inter-gate dielectric layer 37. Further, the lower source-side auxiliary gate 36s may be formed to include a first lower source-side auxiliary gate 33s and a second lower source-side auxiliary gate 35s which are sequentially stacked, and the upper source-side auxiliary gate 42s may be formed to include a first upper source-side auxiliary gate 39s and a second upper source-side auxiliary gate 41s which are sequentially stacked. The second lower source-side auxiliary gate 35s also may be formed to include extensions (35se of FIG. 2) covering the isolation layer 27.

Moreover, a gate connection 42c may be formed on the isolation layer 27 adjacent to the high-voltage active region 27h. The gate connection 42c is formed to connect the upper main gate electrode 42m to the upper drain-side auxiliary gate 42d. The gate connection 42c may extend and be connected to the upper source-side auxiliary gate 42s. The gate connection 42c also may be formed to include a first gate connection 39c and a second gate connection 41c which are sequentially stacked.

The selection line pattern SSL may correspond to a string selection line pattern or a ground selection line pattern of a NAND-type flash memory device: The selection line pattern SSL may be formed to include a selection gate electrode 36sl and a selection line 42sl, which are sequentially stacked. The inter-gate dielectric layer 37 may be interposed between the selection gate electrode 36sl and the selection line 42sl, and the selection line 42sl may be electrically connected to the selection gate electrode 36sl through the cell via hole 39b penetrating the inter-gate dielectric layer 37. More specifically, the selection gate electrode 36sl may be formed to include a lower selection gate electrode 33sl self-aligned with the cell active region 27c and an upper selection gate electrode 35sl crossing over the cell active region 27c. Also, the selection line 42sl may be formed to include a lower selection line 39sl and an upper selection line 41sl which are sequentially stacked.

Furthermore, a word line 42w and a floating gate 36f may be formed in the second region C during formation of the main gate electrode, the auxiliary gate patterns and the selection line patterns SSL. The word line 42w is formed to cross over the cell active region 27c, and the floating gate 36f is formed between the word line 42w and the cell active region 27c. The floating gate 36f also may be formed to include extensions (35fe of FIG. 2) covering the isolation layer 27. The floating gate 36f is electrically insulated from the word line 42w by the inter-gate dielectric layer 37. Also, the floating gate 36f is electrically insulated from the cell active region 27c by the selection gate insulating layer 31, i.e., the tunnel insulating layer.

The floating gate 36f including the floating gate extensions 35fe is formed of the same material layer as the lower main gate electrode 36m, the selection gate electrode 36sl and the lower drain-side auxiliary gate 36d, and the word line 42w is formed of the same material layer as the upper main gate electrode 42m, the selection line 42sl and the upper drain-side auxiliary gate 42d.

The fourth photoresist pattern 43h and 43sl is removed after formation of the main gate electrode, the auxiliary gate patterns, the selection line patterns SSL and the word line 42w. First impurity ions having a conductivity type different from the semiconductor substrate 21 are then implanted into the high-voltage active region 27h, thereby forming a source extension 45s, a source-side auxiliary impurity region 45f', a drain-side auxiliary impurity region 45f'' and a drain extension 45d. The source extension 45s is formed in the high-voltage active region 27h which is adjacent to the lower source-side auxiliary gate 36s and located opposite the lower main gate electrode 36m, and the drain extension 45d is formed in the high-voltage active region 27h which is adjacent to the lower drain-side auxiliary gate 36d and located opposite the lower main gate electrode 36m. Also, the source-side auxiliary impurity region 45f' is formed in the high-voltage active region 27h under a gap region between the lower source-side auxiliary gate 36s and the lower main gate electrode 36m, and the drain-side auxiliary impurity region 45f'' is formed in the high-voltage active region 27h under a gap region between the lower drain-side auxiliary gate 36d and the lower main gate electrode 36m.

Subsequently, a spacer layer is formed on the substrate 21 having the source extension 45s and the drain extension 45d, and the spacer layer is etched using an anisotropic etching technique. As a result, spacers 47b may be formed on sidewalls of the main gate electrode, the auxiliary gate patterns and the selection line pattern SSL. During formation of the spacers 47b, spacer patterns 47a may be formed to fill the gap regions between the main gate electrode and the auxiliary gate patterns. The spacer patterns 47a and the spacers 47b may be formed of an insulating layer such as a silicon nitride layer or a silicon oxide layer.

Figure 10A:
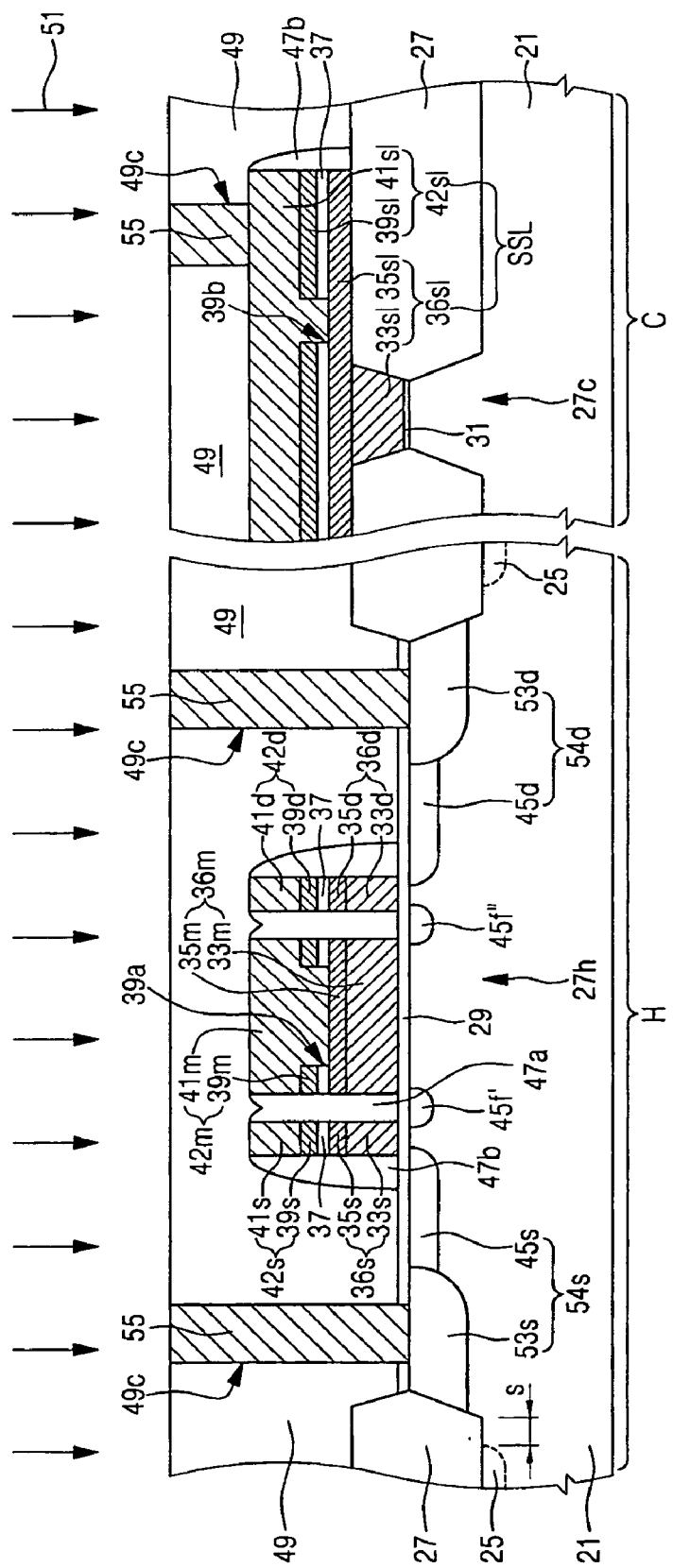
Figure 10B:
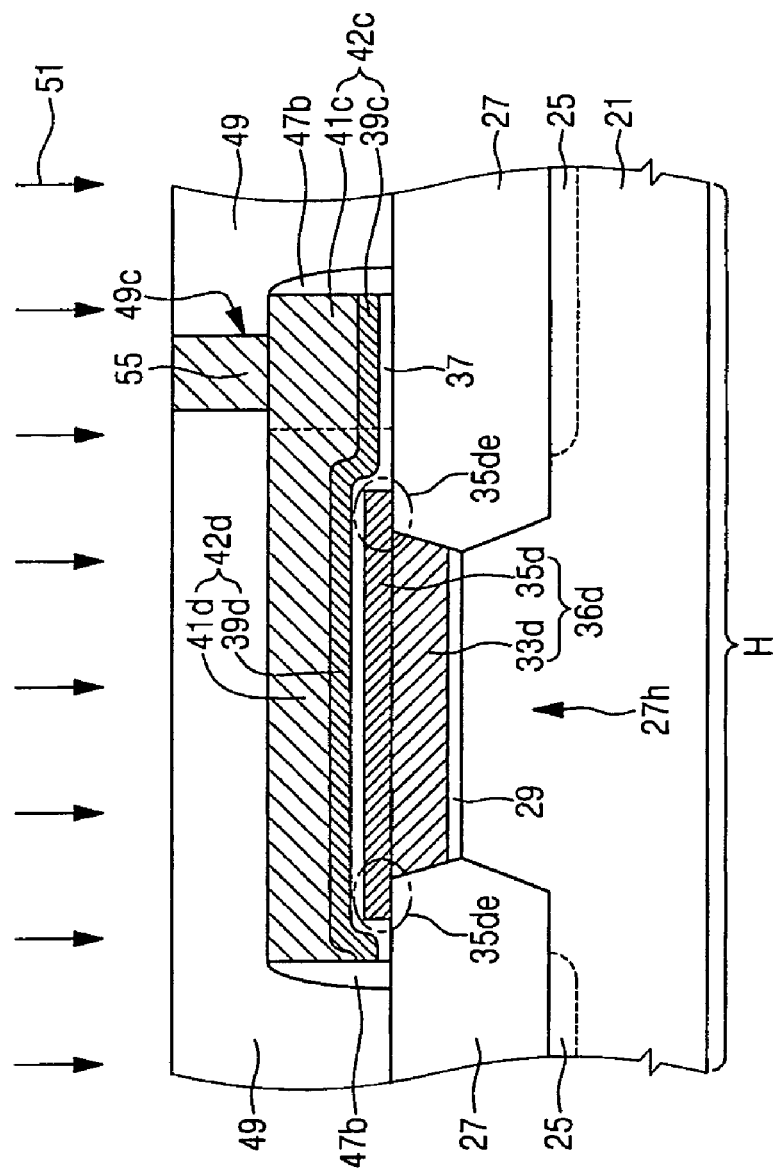

Referring to FIGS. 10A and 10B, an interlayer insulating layer 49 is formed on the substrate 21 having the spacer patterns 47a and the spacers 47b. The interlayer insulating layer 49 is patterned to form contact holes 49c exposing the source and drain extensions 45s and 45d, the gate connection 42c and the selection line 42sl. During formation of the contact holes 49c, the high-voltage gate insulating layer 29 on the source and drain extensions 45s and 45d may be etched. The contact holes 49c may be formed to be spaced apart from the lower source-side auxiliary gate 36s and the lower drain-side auxiliary gate 36d by a specific distance.

Second impurity ions 51 are implanted into the source and drain extensions 45s and 45d exposed by the contact holes 49c, thereby forming a heavily doped source region 53s and a heavily doped drain region 53d. The second impurity ions 51 are impurity ions having the same conductivity type as the first impurity ions. The heavily doped source and drain regions 53s and 53d are formed to have a higher impurity concentration than the source and drain extensions 45s and 45d. The heavily doped source region 53s and the source extension 45s constitute a source region 54s, and the heavily doped drain region 53d and the 5 drain extension 45d constitute a drain region 54d. Conductive contact plugs 55 may be formed in the contact holes 49c.

Figure 11:
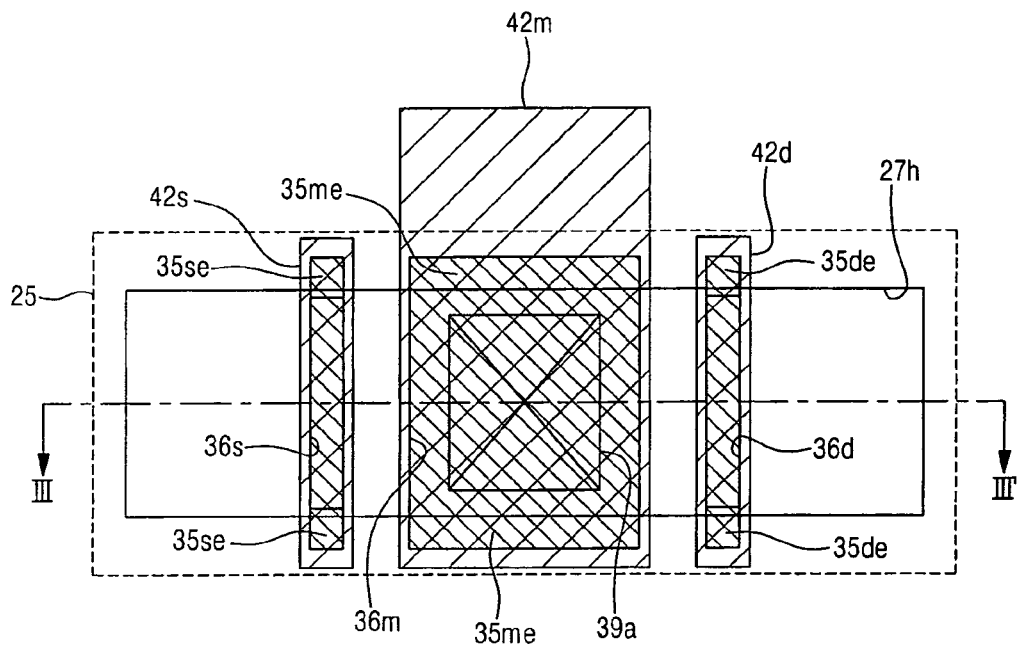
FIG. 11 is a plan view illustrating a high-voltage MOS transistor according to other embodiments of the present invention.
Figure 12:
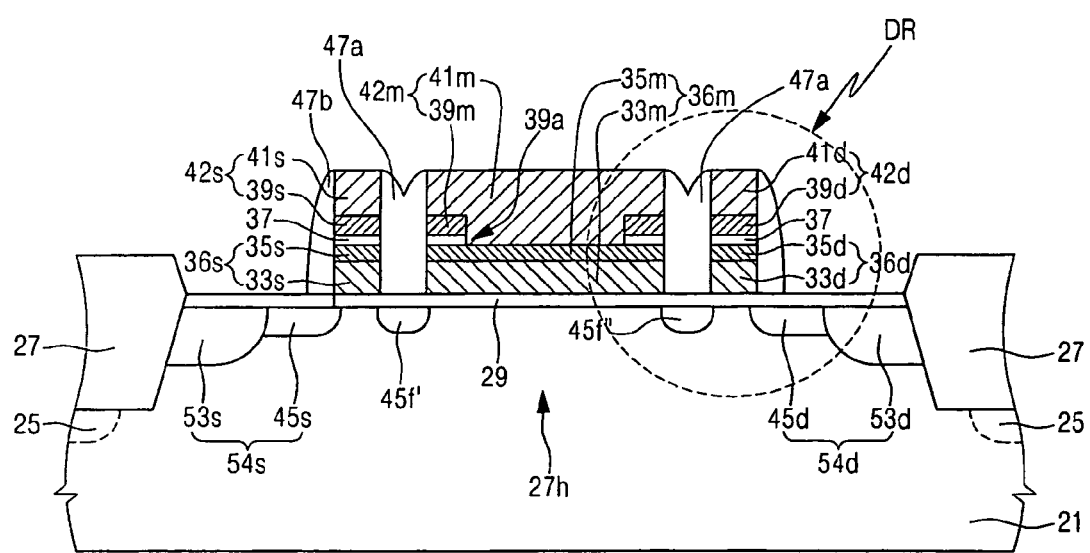
FIG. 12 is a cross-sectional view taken along line III-III' of FIG. 11.
Figure 13:
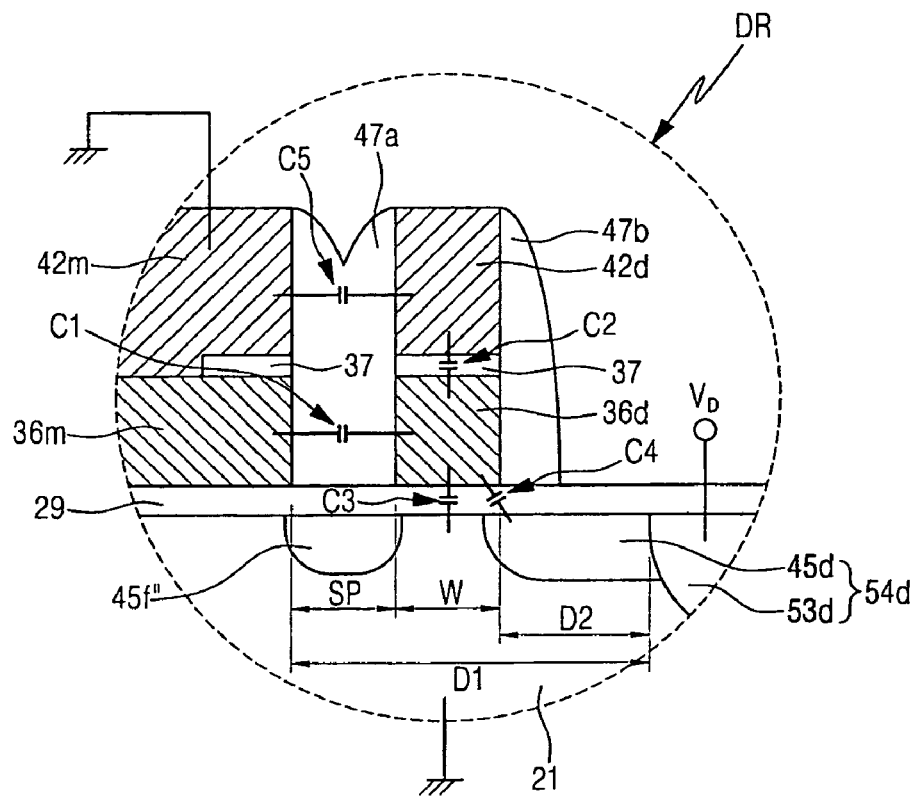
FIG. 13 is an enlarged cross-sectional view of a drain region and a gate structure adjacent thereto shown in FIG. 12.
Figure 14:
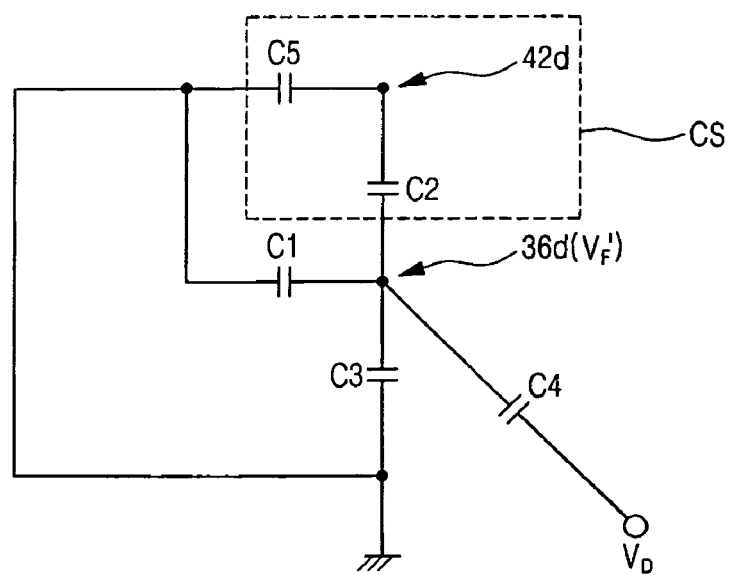
FIG. 14 is an equivalent circuit diagram illustrating a coupling ratio between the drain region and the gate structure shown in FIG. 13.

FIG. 11 is a plan view of a high-voltage MOS transistor according to other embodiments of the present invention, and FIG. 12 is a cross-sectional view taken along line III-III' of FIG. 11. Also, FIG. 13 is an enlarged cross-sectional view of a drain-side region DR of the high-voltage MOS transistor shown in FIG. 12, and FIG. 14 is an equivalent circuit diagram of the drain-side region DR shown in FIG. 13. The present embodiment is different from the embodiment described with reference to FIGS. 2, 3A and 3B in terms of a high-voltage gate structure. Specifically, the high-voltage MOS transistor according to the present embodiment does not include the gate connection 42*c* of the high-voltage MOS transistor shown in FIGS. 2, 3A and 3B. Accordingly, the upper drain-side auxiliary gate 42*d* is electrically insulated from the upper main gate electrode 42*m*, and a fifth parasitic capacitor C5 is additionally provided between the upper drain-side auxiliary gate 42*d* and the upper main gate electrode 42*m* as shown in FIG. 13. As a result, the drain-side region DR of the high-voltage MOS transistor according to the present embodiment may have an equivalent circuit shown in FIG. 14.

Like the high-voltage MOS transistor shown in FIGS. 2, 3A and 3B, the high-voltage MOS transistor shown in FIGS. 11, 12 and 13 also may be turned off by applying a ground voltage to the upper main gate electrode 42*m*, the source region 54*s* and the semiconductor substrate 21 and applying a drain voltage $V_D$ to the drain region 54*d*. In this case, a node voltage $V_F'$ induced at the lower drain-side auxiliary gate 36*d* can be expressed by the following equation 3.

$$V_F' = p \times V_D \quad \text{(equation 3)}$$

wherein, "p" denotes a drain coupling ratio. The drain coupling ratio "p" may be expressed by the following equation 4.

$$P = F4 \div (F1 + FS + F3 + F4) \quad \text{(equation 4)}$$

wherein, "F1", "F3" and "F4" denote capacitances of the first, third and fourth parasitic capacitors C1, C3 and C4, respectively, and "FS" denotes a capacitance of a parasitic capacitor CS composed of the second and fifth parasitic capacitors C2 and C5 serially connected to each other. The parasitic capacitance "FS" can be expressed by the following equation 5.

$$FS = (F2 \times F5) \div (F2 + F5) \quad \text{(equation 5)}$$

wherein, "F2" and "F5" denote parasitic capacitances of the second and fifth parasitic capacitors C2 and C5, respectively.

As can be seen from the equation 5, the parasitic capacitance FS between the upper main gate electrode 42*m* and the upper drain-side auxiliary gate 42*d* is less than the second parasitic capacitance F2. Thus, the drain coupling ratio "p" of the high-voltage MOS transistor according to the present embodiment is always greater than the drain coupling ratio "k" expressed by the equation 2. As a result, the high-voltage MOS transistor according to the present embodiment may exhibit a lower GIDL current than the high-voltage MOS transistor having the drain-side region DR shown in FIG. 4A. That is, the high-voltage MOS transistor according to the present embodiment may exhibit a higher breakdown voltage than the high-voltage MOS transistor having the drain-side region DR shown in FIG. 4A.

Figure 1:
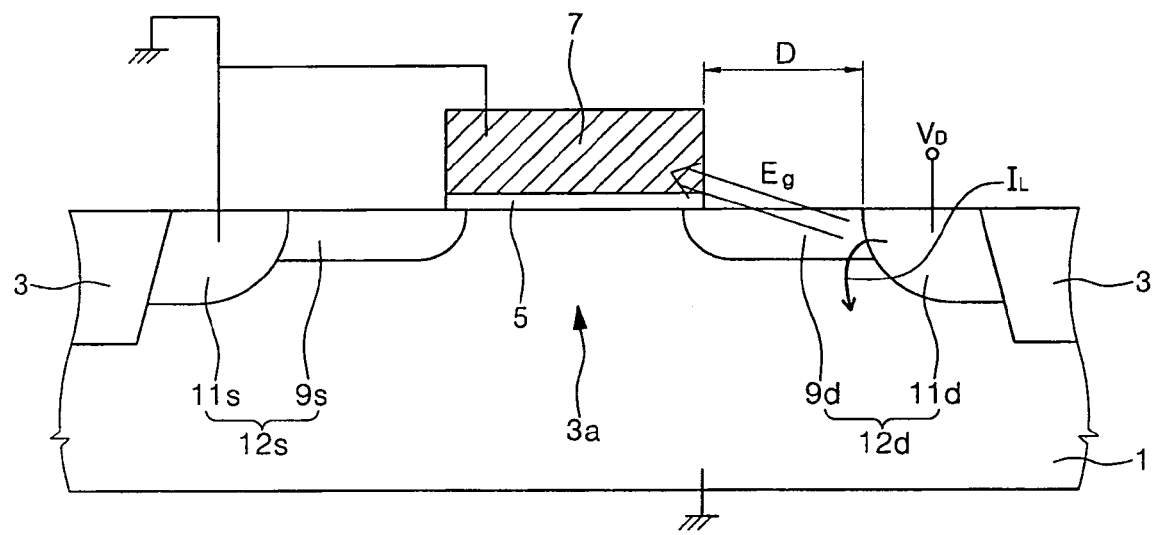
FIG. 1 is a cross-sectional view illustrating a conventional high-voltage MOS transistor.
Figure 15:
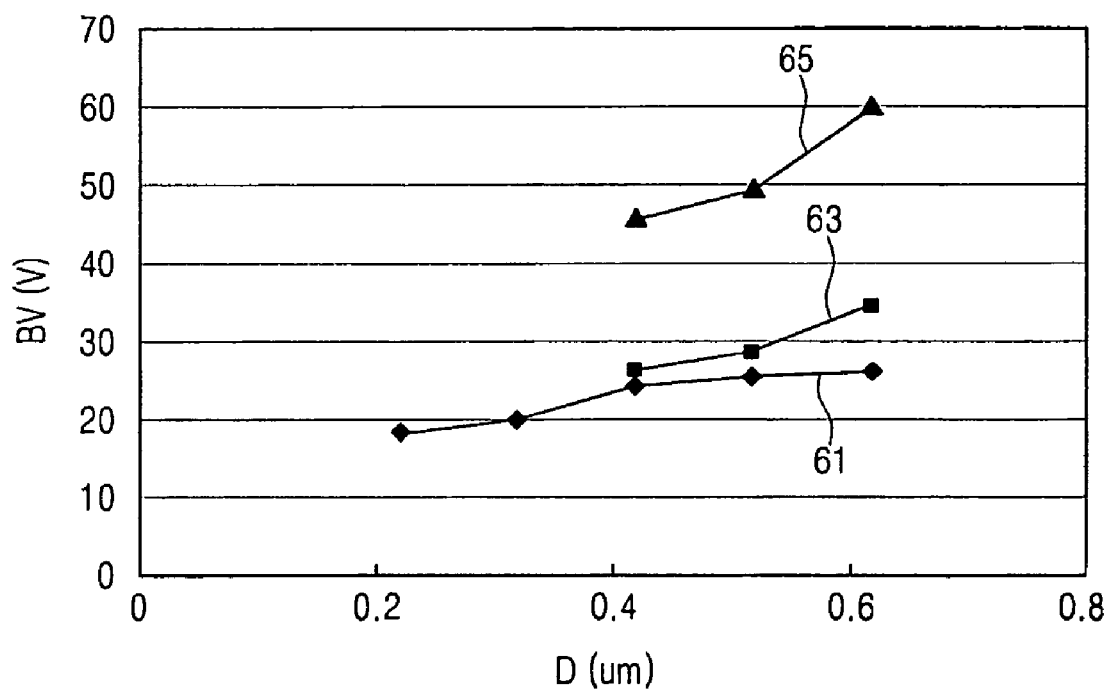
FIG. 15 is a graph illustrating simulation results of drain breakdown voltages of the conventional high-voltage MOS transistor shown in FIG. 1 and the high-voltage MOS transistors according to embodiments of the present invention.

FIG. 15 is a graph showing simulation results of drain breakdown voltages of the conventional high-voltage MOS transistor shown in FIG. 1 and the high-voltage MOS transistors according to embodiments of the present invention. In FIG. 15, the abscissa represents a distance D between a gate electrode and a heavily doped drain region, and the ordinate represents a drain breakdown voltage BV. Also, in FIG. 15, data indicated by a reference numeral 61 denote the drain breakdown voltage of the conventional high-voltage MOS transistor, data indicated by a reference numeral 63 denote the drain breakdown voltage of the high-voltage MOS transistor according to the first embodiment shown in FIG. 4A, and data indicated by reference numeral 65 denote the drain breakdown voltage of the high-voltage MOS transistor according to the second embodiment shown in FIG. 13.

In FIG. 15, the drain breakdown voltages of the high-voltage MOS transistors according to the present invention were simulated under an assumption that the main components shown in FIGS. 4A and 13 have the dimensions described in table 1.

TABLE 1

| Parameters | Present Invention |
| --- | --- |
| Thickness of Upper Drain-side Auxiliary Gate 42d | 2000 Å |
| Thickness of Lower Drain-side Auxiliary Gate 36d | 500 Å |
| Width W of Lower Drain-side Auxiliary Gate 36d | 1200 Å |
| Distance SP between Lower Drain-side Auxiliary Gate 36d and Lower Main Gate Electrode 36m | 1000 Å |
| Thickness of High-voltage Gate Oxide Layer 29 | 330 Å |
| Equivalent Oxide Thickness of Inter-gate Dielectric Layer 37 | 160 Å |
| Material of Spacer Pattern 47a | Silicon Oxide |

Referring to FIG. 15, the high-voltage MOS transistor according to the first embodiment exhibited a higher drain breakdown voltage BV than the conventional high-voltage MOS transistor, and the high-voltage MOS transistor according to the second embodiment exhibited a much higher drain breakdown voltage BV than the high-voltage MOS transistor according to the first embodiment.

According to the present invention as described above, a floated drain-side auxiliary gate is formed between a main gate electrode and a heavily doped drain region. Thus, when the main gate electrode is grounded and a drain voltage is applied to the heavily doped drain region, a gate electric field between the heavily doped drain region and the drain-side auxiliary gate may be reduced due to a voltage induced at the drain-side auxiliary gate. As a result, a GIDL current flowing through a junction of the heavily doped drain region is suppressed to increase a drain breakdown voltage.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A high-voltage MOS transistor comprising:
   a source region and a drain region provided in a semiconductor substrate;
   a main gate electrode disposed over the semiconductor substrate between the drain region and the source region and electrically insulated from the semiconductor substrate;
   an inter-gate dielectric layer disposed on the semiconductor substrate; and
   a lower drain-side auxiliary gate and an upper drain-side auxiliary gate sequentially stacked over the semiconductor substrate between the main gate electrode and the drain region,
   wherein the lower drain-side auxiliary gate is electrically insulated from the semiconductor substrate, the main gate electrode and the upper drain-side auxiliary gate, and wherein the main gate electrode includes a lower main gate electrode and an upper main gate electrode electrically connected to each other through a gate via hole penetrating the inter-gate dielectric layer, and wherein the drain region comprises:
a heavily doped drain region spaced apart from the lower drain-side auxiliary gate; and
a drain extension extending from the heavily doped drain region to be adjacent to the lower drain-side auxiliary gate, the drain extension having a lower impurity concentration than the heavily doped drain region.

2. The high-voltage MOS transistor according to claim 1, wherein the source region and the drain region are N-type impurity regions or P-type impurity regions.

3. The high-voltage MOS transistor according to claim 1, further comprising a drain-side auxiliary impurity region provided in the semiconductor substrate under a gap region between the main gate electrode and the lower drain-side auxiliary gate,
wherein the drain-side auxiliary impurity region has the same conductivity type and the same impurity concentration as the drain extension.

4. The high-voltage MOS transistor according to claim 1, wherein the inter-gate dielectric layer is disposed between the lower drain-side auxiliary gate and the upper drain-side auxiliary gate.

5. The high-voltage MOS transistor according to claim 1, wherein the upper drain-side auxiliary gate is electrically insulated from the main gate electrode.

6. The high-voltage MOS transistor according to claim 1, further comprising a gate connection extending from the main gate electrode to electrically connect the main gate electrode to the upper drain-side auxiliary gate.

7. The high-voltage MOS transistor according to claim 1, further comprising:
an insulating spacer pattern filling gap regions between the main gate electrode and the drain-side auxiliary gates; and
an insulating spacer covering sidewalls of the drain-side auxiliary gates adjacent to the drain region.

8. A high-voltage MOS transistor comprising:
an isolation layer provided in a predetermined region of a semiconductor substrate to define an active region;
a source region and a drain region provided in the active region;
a drain-side auxiliary impurity region provided in the active region between the source region and the drain region;
a main gate electrode disposed over the active region between the drain-side auxiliary impurity region and the source region, the main gate electrode including a lower main gate electrode and an upper main gate electrode electrically connected to each other;
a drain-side auxiliary gate pattern disposed over the active region between the drain-side auxiliary impurity region and the drain region, the drain-side auxiliary gate pattern including a lower drain-side auxiliary gate, an upper drain-side auxiliary gate and an inter-gate dielectric layer interposed between the lower and upper drain-side auxiliary gates; and
a high-voltage gate insulating layer disposed between the main gate electrode and the active region as well as between the drain-side auxiliary gate pattern and the active region.

9. The high-voltage MOS transistor according to claim 8, wherein the source region, the drain region and the drain-side auxiliary impurity region are P-type impurity regions or N-type impurity regions.

10. The high-voltage MOS transistor according to claim 8, wherein the drain region comprises:
a heavily doped drain region spaced apart from the lower drain-side auxiliary gate; and
a drain extension extending from the heavily doped drain region to be adjacent to the lower drain-side auxiliary gate,
wherein the drain extension has a lower impurity concentration than the heavily doped drain region and the same impurity concentration as the drain-side auxiliary impurity region.

11. The high-voltage MOS transistor according to claim 8, wherein the lower drain-side auxiliary gate is the same material layer as the lower main gate electrode, and wherein the upper drain-side auxiliary gate is the same material layer as the upper main gate electrode.

12. The high-voltage MOS transistor according to claim 8, further comprising an inter-gate dielectric layer interposed between the lower main gate electrode and the upper main gate electrode,
wherein the upper main gate electrode is electrically connected to the lower main gate electrode through a gate via hole penetrating the inter-gate dielectric layer.

13. The high-voltage MOS transistor according to claim 8, further comprising a gate connection extending from the upper main gate electrode to electrically connect the upper main gate electrode to the upper drain-side auxiliary gate,
wherein the gate connection is disposed on the isolation layer.

14. The high-voltage MOS transistor according to claim 8, further comprising:
a source-side auxiliary impurity region provided in the active region between the source region and the drain-side auxiliary impurity region;
a source-side auxiliary gate pattern disposed over the active region between the source region and the source-side auxiliary impurity region, the source-side auxiliary gate pattern including a lower source-side auxiliary gate electrically insulated from the active region, an upper source-side auxiliary gate disposed over the lower source-side auxiliary gate, and an inter-gate dielectric layer disposed between the lower and upper source-side auxiliary gates; and
a high-voltage gate insulating layer interposed between the source-side auxiliary gate pattern and the active region,
wherein the main gate electrode is disposed over the active region between the source-side auxiliary impurity region and the drain-side auxiliary impurity region.

15. The high-voltage MOS transistor according to claim 14, wherein the source-side auxiliary impurity region has the same conductivity type and the same impurity concentration as the drain-side auxiliary impurity region.

16. The high-voltage MOS transistor according to claim 14, wherein the source region comprises:
a heavily doped source region spaced apart from the lower source-side auxiliary gate; and
a source extension extending from the heavily doped source region to be adjacent to the lower source-side auxiliary gate,
wherein the source extension has a lower impurity concentration than the heavily doped source region and the same impurity concentration as the source-side auxiliary impurity region.

17. The high-voltage MOS transistor according to claim 14, wherein the source-side auxiliary gate pattern has the same structure as the drain-side auxiliary gate pattern.

18. The high-voltage MOS transistor according to claim 14, wherein the upper source-side auxiliary gate and the lower source-side auxiliary gate are electrically insulated from the main gate electrode.

19. The high-voltage MOS transistor according to claim 14, further comprising a gate connection electrically connecting the upper main gate electrode to the upper source-side auxiliary gate.

20. A nonvolatile memory device comprising:
   a semiconductor substrate having a first region and a second region;
   an isolation layer provided in a predetermined region of the semiconductor substrate to define a high-voltage active region and a cell active region in the first and second regions, respectively;
   a source region and a drain region provided in the high-voltage active region;
   a drain-side auxiliary impurity region provided in the high-voltage active region between the source region and the drain region;
   a main gate electrode disposed over the high-voltage active region between the drain-side auxiliary impurity region and the source region, the main gate electrode including a lower main gate electrode and an upper main gate electrode electrically connected to each other;
   a drain-side auxiliary gate pattern disposed over the high-voltage active region between the drain-side auxiliary impurity region and the drain region, the drain-side auxiliary gate pattern including a lower drain-side auxiliary gate, an upper drain-side auxiliary gate and an inter-gate dielectric layer interposed between the lower and upper drain-side auxiliary gates; and
   a high-voltage gate insulating layer interposed between the main gate electrode and the high-voltage active region as well as between the drain-side auxiliary gate pattern and the high-voltage active region,
   wherein the lower drain-side auxiliary gate is electrically insulated from the main gate electrode and the upper drain-side auxiliary gate.

21. The nonvolatile memory device according to claim 20, wherein the source region, the drain region and the drain-side auxiliary impurity region are P-type impurity regions or N-type impurity regions.

22. The nonvolatile memory device according to claim 20, wherein the drain region comprises:
   a heavily doped drain region spaced apart from the lower drain-side auxiliary gate; and
   a drain extension extending from the heavily doped drain region to be adjacent to the lower drain-side auxiliary gate,
   wherein the drain extension has a lower impurity concentration than the heavily doped drain region and the same impurity concentration as the drain-side auxiliary impurity region.

23. The nonvolatile memory device according to claim 20, wherein the lower drain-side auxiliary gate is the same material layer as the lower main gate electrode, and wherein the upper drain-side auxiliary gate is the same material layer as the upper main gate electrode.

24. The nonvolatile memory device according to claim 20, further comprising an inter-gate dielectric layer interposed between the lower main gate electrode and the upper main gate electrode,
   wherein the upper main gate electrode is electrically connected to the lower main gate electrode through a gate via hole penetrating the inter-gate dielectric layer.

25. The nonvolatile memory device according to claim 20, further comprising a gate connection extending from the upper main gate electrode to electrically connect the upper main gate electrode to the upper drain-side auxiliary gate,
   wherein the gate connection is disposed on the isolation layer.

26. The nonvolatile memory device according to claim 20, further comprising:
   a source-side auxiliary impurity region provided in the high-voltage active region between the source region and the drain-side auxiliary impurity region;
   a source-side auxiliary gate pattern disposed over the high-voltage active region between the source region and the source-side auxiliary impurity region, the source-side auxiliary gate pattern including a lower source-side auxiliary gate, an upper source-side auxiliary gate and an inter-gate dielectric layer interposed between the lower and upper source-side auxiliary gates; and
   a high-voltage gate insulating layer interposed between the source-side auxiliary gate pattern and the high-voltage active region,
   wherein the main gate electrode is disposed over the high-voltage active region between the source-side auxiliary impurity region and the drain-side auxiliary impurity region.

27. The nonvolatile memory device according to claim 26, wherein the source-side auxiliary impurity region has the same conductivity type and the same impurity concentration as the drain-side auxiliary impurity region.

28. The nonvolatile memory device according to claim 26, wherein the source region comprises:
   a heavily doped source region spaced apart from the lower source-side auxiliary gate; and
   a source extension extending from the heavily doped source region to be adjacent to the lower source-side auxiliary gate,
   wherein the source extension has a lower impurity concentration than the heavily doped source region and the same impurity concentration as the source-side auxiliary impurity region.

29. The nonvolatile memory device according to claim 26, wherein the source-side auxiliary gate pattern has the same structure as the drain-side auxiliary gate pattern.

30. The nonvolatile memory device according to claim 26, wherein the upper source-side auxiliary gate and the lower source-side auxiliary gate are electrically insulated from the main gate electrode.

31. The nonvolatile memory device according to claim 26, further comprising a gate connection electrically connecting the upper main gate electrode to the upper source-side auxiliary gate.

32. The nonvolatile memory device according to claim 20, further comprising:
   a word line crossing over the cell active region;
   a floating gate interposed between the word line and the cell active region; and
   an inter-gate dielectric layer interposed between the word line and the floating gate.

33. The nonvolatile memory device according to claim 32, further comprising:
   a selection line crossing over the cell active region;
   a selection gate electrode interposed between the selection line and the cell active region and electrically insulated from the selection line by the inter-gate dielectric layer; and
   a selection gate insulating layer interposed between the selection gate electrode and the cell active region, wherein the selection line is electrically connected to the selection gate electrode through a cell via hole penetrating the inter-gate dielectric layer and wherein the selection gate insulating layer is thinner than the high-voltage gate insulating layer.

34. The nonvolatile memory device according to claim 33, wherein the selection gate electrode is the same material layer as the lower drain-side auxiliary gate and wherein the selection line is the same material layer as the upper drain-side auxiliary gate.

35. A method of fabricating a high-voltage MOS transistor, comprising:
    forming an isolation layer in a predetermined region of a semiconductor substrate to define an active region;
    forming a high-voltage gate insulating layer on the active region;
    forming a lower gate pattern to cover the high-voltage gate insulating layer;
    forming an inter-gate dielectric layer on the semiconductor substrate having the lower gate pattern;
    forming an upper gate conductive layer on the inter-gate dielectric layer, the upper gate conductive layer being formed to be in contact with the lower gate pattern through a gate via hole penetrating the inter-gate dielectric layer; and
    patterning the upper gate conductive layer, the inter-gate dielectric layer and the lower gate pattern to form a main gate electrode, a drain-side auxiliary gate pattern and a source-side auxiliary gate pattern crossing over the active region,
    wherein the main gate electrode is formed to include a lower main gate electrode and an upper main gate electrode electrically connected to each other through the gate via hole,
    wherein the drain-side auxiliary gate pattern is formed to include a lower drain-side auxiliary gate and an upper drain-side auxiliary gate electrically insulated from each other by the inter-gate dielectric layer, and
    wherein the source-side auxiliary gate pattern is formed to include a lower source-side auxiliary gate and an upper source-side auxiliary gate electrically insulated from each other by the inter-gate dielectric layer.

36. The method according to claim 35, further comprising:
    implanting impurity ions into the active region using the main gate electrode, the drain-side auxiliary gate pattern and the source-side auxiliary gate pattern as ion implantation masks to form a drain extension, a source extension, a drain-side auxiliary impurity region and a source-side auxiliary impurity region, the drain extension being formed in the active region which is adjacent to the drain-side auxiliary gate pattern and located opposite the main gate electrode, the source extension being formed in the active region which is adjacent to the source-side auxiliary gate pattern and located opposite the main gate electrode, the drain-side auxiliary impurity region being formed in the active region under a gap region between the main gate electrode and the drain-side auxiliary gate pattern, and the source-side auxiliary impurity region being formed in the active region under a gap region between the main gate electrode and the source-side auxiliary gate pattern; and
    forming a heavily doped source region and a heavily doped drain region in the source extension and the drain extension, respectively,
    wherein at least the heavily doped drain region is formed to be spaced apart from the drain-side auxiliary gate pattern.

37. A high-voltage MOS transistor comprising:
    a source region and a drain region provided in a semiconductor substrate;
    a main gate electrode disposed over the semiconductor substrate between the drain region and the source region and electrically insulated from the semiconductor substrate;
    an inter-gate dielectric layer disposed on the semiconductor substrate;
    a lower drain-side auxiliary gate and an upper drain-side auxiliary gate sequentially stacked over the semiconductor substrate between the main gate electrode and the drain region; and
    a gate connection extending from the main gate electrode to electrically connect the main gate electrode to the upper drain-side auxiliary gate,
    wherein the lower drain-side auxiliary gate is electrically insulated from the semiconductor substrate, the main gate electrode and the upper drain-side auxiliary gate, and wherein the main gate electrode includes a lower main gate electrode and an upper main gate electrode electrically connected to each other through a gate via hole penetrating the inter-gate dielectric layer.

38. A high-voltage MOS transistor comprising:
    a source region and a drain region provided in a semiconductor substrate;
    a main gate electrode disposed over the semiconductor substrate between the drain region and the source region and electrically insulated from the semiconductor substrate;
    an inter-gate dielectric layer disposed on the semiconductor substrate;
    a lower drain-side auxiliary gate and an upper drain-side auxiliary gate sequentially stacked over the semiconductor substrate between the main gate electrode and the drain region;
    an insulating spacer pattern filling gap regions between the main gate electrode and the drain-side auxiliary gates; and
    an insulating spacer covering sidewalls of the drain-side auxiliary gates adjacent to the drain region,
    wherein the lower drain-side auxiliary gate is electrically insulated from the semiconductor substrate, the main gate electrode and the upper drain-side auxiliary gate, and wherein the main gate electrode includes a lower main gate electrode and an upper main gate electrode electrically connected to each other through a gate via hole penetrating the inter-gate dielectric layer.

* * * * *